(12) United States Patent
Sakamoto et al.

(10) Patent No.: US 8,453,323 B2
(45) Date of Patent: *Jun. 4, 2013

(54) PRINTED CIRCUIT BOARD MANUFACTURING METHOD

(75) Inventors: Hajime Sakamoto, Ibi-gun (JP); Tadashi Sugiyama, Ibi-gun (JP); Dongdong Wang, Ibi-gun (JP); Takashi Kariya, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 32 days.

This patent is subject to a terminal disclaimer.

(21) Appl. No.: 13/234,721

(22) Filed: Sep. 16, 2011

(65) Prior Publication Data

US 2012/0000068 A1    Jan. 5, 2012

Related U.S. Application Data

(60) Continuation of application No. 12/273,939, filed on Nov. 19, 2008, now Pat. No. 8,079,142, which is a continuation of application No. 12/103,414, filed on Apr. 15, 2008, now Pat. No. 8,186,045, which is a division of application No. 10/793,515, filed on Mar. 4, 2004, now Pat. No. 7,435,910, which is a continuation of application No. 10/181,682, filed as application No. PCT/JP01/00177 on Jan. 12, 2001, now Pat. No. 6,909,054.

(30) Foreign Application Priority Data

| Feb. 25, 2000 | (JP) | 2000-049121 |
| Mar. 16, 2000 | (JP) | 2000-073558 |
| Mar. 21, 2000 | (JP) | 2000-078206 |
| Apr. 6, 2000 | (JP) | 2000-105212 |
| May 24, 2000 | (JP) | 2000-152973 |

(51) Int. Cl.
| H01K 3/10 | (2006.01) |
| H05K 1/16 | (2006.01) |
| H05K 7/10 | (2006.01) |
| H01L 21/00 | (2006.01) |

(52) U.S. Cl.
USPC .......... 29/852; 29/830; 29/831; 29/832; 29/840; 29/842; 29/846; 174/260; 361/767

(58) Field of Classification Search
USPC .......... 29/852, 830, 831, 832, 840, 842, 29/846; 174/260, 261, 262, 263, 250; 361/767, 361/795, 792, 783; 437/209, 211, 214; 216/18, 216/20
See application file for complete search history.

(56) References Cited

U.S. PATENT DOCUMENTS

| 3,495,324 A | 2/1970 | Guthrie et al. |
| 3,775,844 A | 12/1973 | Parks |
| 3,903,590 A | 9/1975 | Yokogawa |
| 4,356,223 A | 10/1982 | Iida et al. |
| 4,372,996 A | 2/1983 | Guditz et al. |
| 4,751,146 A | 6/1988 | Maeda et al. |
| 4,783,695 A | 11/1988 | Eichelberger et al. |
| 4,835,704 A | 5/1989 | Eichelberger et al. |
| 4,894,115 A | 1/1990 | Eichelberger et al. |
| 5,021,016 A | 6/1991 | Currey |
| 5,042,145 A | 8/1991 | Boucquest |
| 5,073,814 A | 12/1991 | Cole et al. |
| 5,081,563 A | 1/1992 | Feng et al. |
| 5,108,950 A | 4/1992 | Wakabayashi et al. |
| 5,111,278 A | 5/1992 | Eichelberger |
| 5,126,016 A | 6/1992 | Glenning et al. |
| 5,130,889 A | 7/1992 | Hamburgen et al. |
| 5,161,093 A | 11/1992 | Gorczyca et al. |
| 5,250,843 A | 10/1993 | Eichelberger |
| 5,289,631 A | 3/1994 | Koopman et al. |
| 5,297,006 A | 3/1994 | Mizukoshi |
| 5,304,511 A | 4/1994 | Sakai |
| 5,309,322 A | 5/1994 | Wagner et al. |
| 5,318,923 A | 6/1994 | Park |
| 5,353,498 A | 10/1994 | Fillion et al. |
| 5,386,623 A | 2/1995 | Okamoto et al. |
| 5,410,184 A | 4/1995 | Melton et al. |
| 5,434,751 A * | 7/1995 | Cole et al. ............. 361/792 |
| 5,455,459 A | 10/1995 | Fillion et al. |
| 5,521,122 A | 5/1996 | Kuramochi |
| 5,524,339 A * | 6/1996 | Gorowitz et al. .......... 29/841 |

| | | | | | | |
|---|---|---|---|---|---|---|
| 5,527,741 | A | 6/1996 | Cole et al. | 8,186,045 B2 * | 5/2012 | Sakamoto et al. ............... 29/832 |
| 5,563,449 | A | 10/1996 | Dion et al. | 8,293,579 B2 * | 10/2012 | Sakamoto et al. ............ 438/110 |
| 5,596,227 | A | 1/1997 | Saito | 2002/0000239 A1 | 1/2002 | Sachdev et al. |
| 5,629,564 | A | 5/1997 | Nye, III et al. | 2003/0014863 A1 | 1/2003 | Lee et al. |
| 5,700,716 | A | 12/1997 | Sharan et al. | 2003/0134233 A1 | 7/2003 | Su et al. |
| 5,710,063 | A | 1/1998 | Forehand et al. | 2004/0166661 A1 | 8/2004 | Lei |
| 5,713,127 | A | 2/1998 | Chobot et al. | 2004/0222522 A1 | 11/2004 | Homma |
| 5,745,984 | A | 5/1998 | Cole et al. | 2005/0014355 A1 | 1/2005 | Chan et al. |
| 5,757,072 | A | 5/1998 | Gorowitz et al. | | | |
| 5,773,899 | A | 6/1998 | Zambrano | FOREIGN PATENT DOCUMENTS | | |
| 5,817,405 | A * | 10/1998 | Bhatt et al. ............. 428/209 | EP | 0 465 138 A2 | 1/1992 |
| 5,829,125 | A * | 11/1998 | Fujimoto et al. ............. 29/840 | EP | 0 471 938 | 2/1992 |
| 5,841,193 | A | 11/1998 | Eichelberger | EP | 0 777 274 | 6/1997 |
| 5,862,583 | A | 1/1999 | Ammann et al. | EP | 0 884 128 A1 | 12/1998 |
| 5,879,568 | A | 3/1999 | Urasaki et al. | EP | 1 003 209 | 5/2000 |
| 5,887,343 | A | 3/1999 | Salatino et al. | EP | 1 024 531 | 8/2000 |
| 5,920,123 | A | 7/1999 | Moden | EP | 1 032 030 | 8/2000 |
| 5,937,320 | A | 8/1999 | Andricacos et al. | EP | 1 039 789 A1 | 9/2000 |
| 5,940,688 | A | 8/1999 | Higuchi et al. | EP | 1 259 103 A1 | 11/2002 |
| 5,943,597 | A | 8/1999 | Kleffner et al. | JP | 2-58345 | 2/1990 |
| 5,969,424 | A | 10/1999 | Matsuki et al. | JP | 02-312296 | 12/1990 |
| 5,972,736 | A | 10/1999 | Malladi et al. | JP | 3-24786 | 2/1991 |
| 5,985,377 | A | 11/1999 | Corbett | JP | 03-038084 | 2/1991 |
| 5,998,859 | A | 12/1999 | Griswold et al. | JP | 3-50734 | 3/1991 |
| 6,025,995 | A | 2/2000 | Marcinkiewicz | JP | 03-77327 | 4/1991 |
| 6,110,806 | A | 8/2000 | Pogge | JP | 03-101234 | 4/1991 |
| 6,111,321 | A | 8/2000 | Agarwala | JP | 4-25038 | 1/1992 |
| 6,153,829 | A | 11/2000 | Carapella et al. | JP | 04-065832 | 3/1992 |
| 6,154,366 | A | 11/2000 | Ma et al. | JP | 4-72656 | 3/1992 |
| 6,162,652 | A | 12/2000 | Dass et al. | JP | 4-154197 A | 5/1992 |
| 6,193,132 | B1 | 2/2001 | Shibata et al. | JP | 4-233265 | 8/1992 |
| 6,232,212 | B1 | 5/2001 | Degani et al. | JP | 05-046069 | 6/1993 |
| 6,232,558 | B1 | 5/2001 | Tsukada et al. | JP | 5-160588 A | 6/1993 |
| 6,235,453 | B1 | 5/2001 | You et al. | JP | 05-275856 | 10/1993 |
| 6,236,108 | B1 | 5/2001 | Sota et al. | JP | 06-268098 | 9/1994 |
| 6,248,428 | B1 | 6/2001 | Asai et al. | JP | 06-268101 A | 9/1994 |
| 6,256,875 | B1 | 7/2001 | Watanabe et al. | JP | 06-350020 | 12/1994 |
| 6,271,469 | B1 | 8/2001 | Ma et al. | JP | 07-058276 A | 3/1995 |
| 6,281,046 | B1 | 8/2001 | Lam | JP | 8-78572 | 3/1996 |
| 6,292,366 | B1 | 9/2001 | Platt | JP | 8-255855 A | 10/1996 |
| 6,294,741 | B1 * | 9/2001 | Cole et al. ............. 174/260 | JP | 8-330313 | 12/1996 |
| 6,317,948 | B1 | 11/2001 | Kola et al. | JP | 9-278494 | 10/1997 |
| 6,324,067 | B1 | 11/2001 | Nishiyama | JP | 09-321408 | 12/1997 |
| 6,327,158 | B1 | 12/2001 | Kelkar et al. | JP | 10-098081 | 4/1998 |
| 6,330,259 | B1 | 12/2001 | Dahm | JP | 10-189635 | 7/1998 |
| 6,337,228 | B1 | 1/2002 | Juskey et al. | JP | 10-199886 | 7/1998 |
| 6,339,197 | B1 | 1/2002 | Fushie et al. | JP | 10-256429 | 9/1998 |
| 6,365,833 | B1 | 4/2002 | Eng et al. | JP | 10-256737 A | 9/1998 |
| 6,370,013 | B1 | 4/2002 | Iino et al. | JP | 10-284632 | 10/1998 |
| 6,395,073 | B1 | 5/2002 | Dauber | JP | 10-321634 A | 12/1998 |
| 6,399,230 | B1 | 6/2002 | Tormey et al. | JP | 11-54939 | 2/1999 |
| 6,421,225 | B2 | 7/2002 | Bergstedt | JP | 11-103166 | 4/1999 |
| 6,433,360 | B1 | 8/2002 | R. Dosdos et al. | JP | 11-111738 | 4/1999 |
| 6,560,860 | B2 | 5/2003 | Shepherd | JP | 11-126978 | 5/1999 |
| 6,586,276 | B2 | 7/2003 | Towle et al. | JP | 11-145174 | 5/1999 |
| 6,606,792 | B1 | 8/2003 | Andresakis | JP | 11-163213 A | 6/1999 |
| 6,627,997 | B1 | 9/2003 | Eguchi et al. | JP | 11-176977 | 7/1999 |
| 6,657,707 | B1 | 12/2003 | Morken et al. | JP | 11-220262 A | 8/1999 |
| 6,667,230 | B2 | 12/2003 | Chen et al. | JP | 11-233678 | 8/1999 |
| 6,750,135 | B2 | 6/2004 | Elenius et al. | JP | 11-251754 A | 9/1999 |
| 6,756,295 | B2 | 6/2004 | Lin et al. | JP | 11-274734 | 10/1999 |
| 6,782,897 | B2 | 8/2004 | Wang et al. | JP | 2000-21916 | 1/2000 |
| 6,909,054 | B2 * | 6/2005 | Sakamoto et al. ............. 174/260 | JP | 2000-150705 | 5/2000 |
| 7,008,867 | B2 | 3/2006 | Lei | JP | 2000-151079 | 5/2000 |
| 7,189,596 | B1 | 3/2007 | Mu et al. | JP | 2000-228423 | 8/2000 |
| 7,405,149 | B1 | 7/2008 | Lin et al. | JP | 2000-243754 | 9/2000 |
| 7,435,910 | B2 * | 10/2008 | Sakamoto et al. ............. 174/260 | JP | 2000-260902 | 9/2000 |
| 7,842,887 | B2 | 11/2010 | Kariya et al. | JP | 2000-323645 | 11/2000 |
| 7,852,634 | B2 | 12/2010 | Sakamoto et al. | KR | 121735 | 11/1997 |
| 7,855,342 | B2 | 12/2010 | Sakamoto et al. | KR | 1999-2341 | 1/1999 |
| 7,884,286 | B2 | 2/2011 | Kariya et al. | WO | 99/30542 | 6/1999 |
| 7,888,605 | B2 * | 2/2011 | Sakamoto et al. ............. 174/260 | WO | 00/63970 | 10/2000 |
| 7,888,606 | B2 * | 2/2011 | Sakamoto et al. ............. 174/260 | | | |
| 7,893,360 | B2 * | 2/2011 | Sakamoto et al. ............. 174/260 | | | |
| 7,908,745 | B2 | 3/2011 | Sakamoto et al. | | | |
| 7,999,387 | B2 * | 8/2011 | Sakamoto et al. ............. 257/762 | | | |
| 8,046,914 | B2 * | 11/2011 | Sakamoto et al. ............. 29/852 | | | |
| 8,067,699 | B2 * | 11/2011 | Sakamoto et al. ............. 174/260 | | | |
| 8,079,142 | B2 * | 12/2011 | Sakamoto et al. ............. 29/852 | | | |

OTHER PUBLICATIONS

Gdula et al., US XP 000393639 "A High-Speed, High-Density Multiprocessing Module Made with the General Electric High-Density Interconnect Technology" vol. 2, No. 4, Oct. 1, 1992, pp. 247-251 (cited in the European Search Report EP 01900747.

U.S. Appl. No. 12/103,401, filed Apr. 15, 2008, Kariya, et al.

* cited by examiner

*Primary Examiner* — Peter DungBa Vo
*Assistant Examiner* — Kaying Kue
(74) *Attorney, Agent, or Firm* — Oblon, Spivak, McClelland, Maier & Neustadt, L.L.P.

(57) ABSTRACT

A method for manufacturing a printed circuit board, including providing a core substrate having an electronic component accommodated in the core substrate; forming a positioning mark on the core substrate; forming an interlayer insulating layer over the core substrate, the positioning mark and the electronic component; forming a via hole opening connecting to the electronic component through the interlayer insulating layer in accordance with the positioning mark on the core substrate; and forming a via hole structure in the via hole opening in the interlayer insulating layer such that the via hole structure is electrically connected to the electronic component.

17 Claims, 30 Drawing Sheets

Fig. 1
(A)
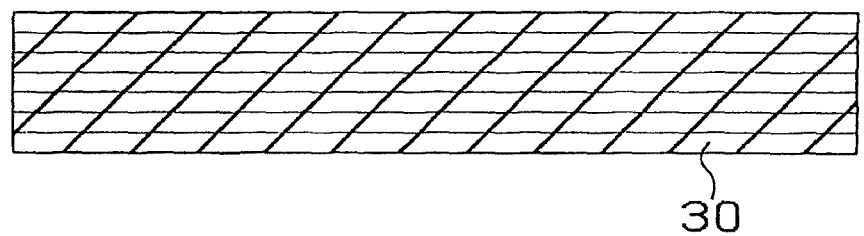
(B)
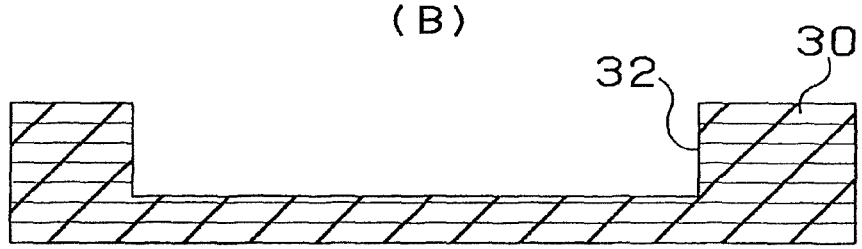
(C)
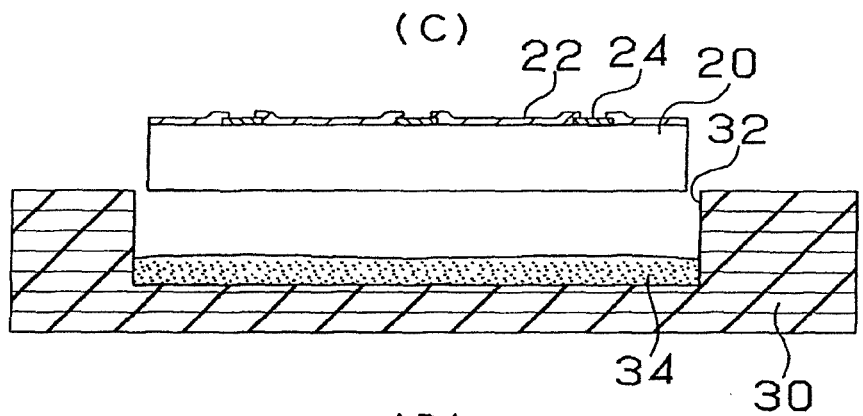
(D)
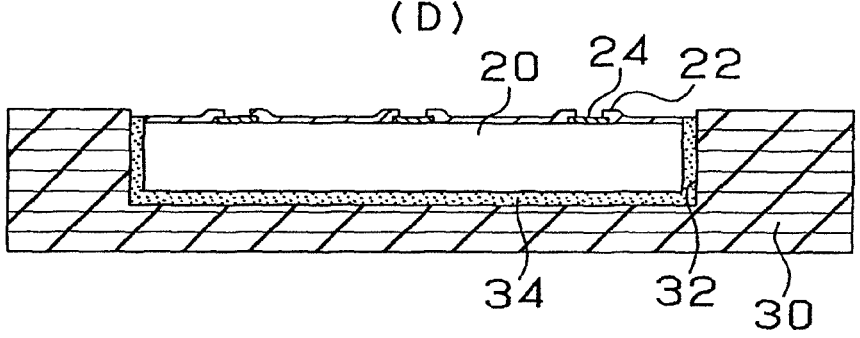

Fig. 2
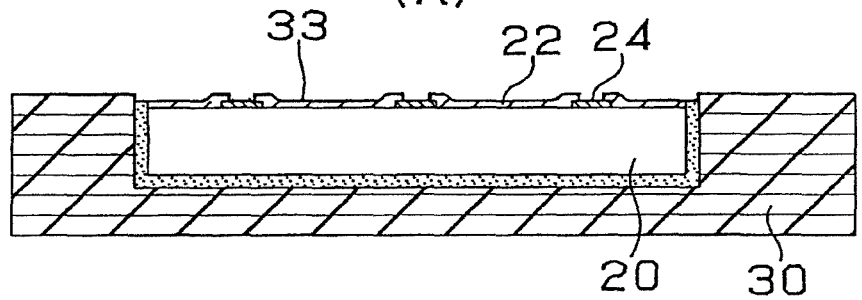
(A)
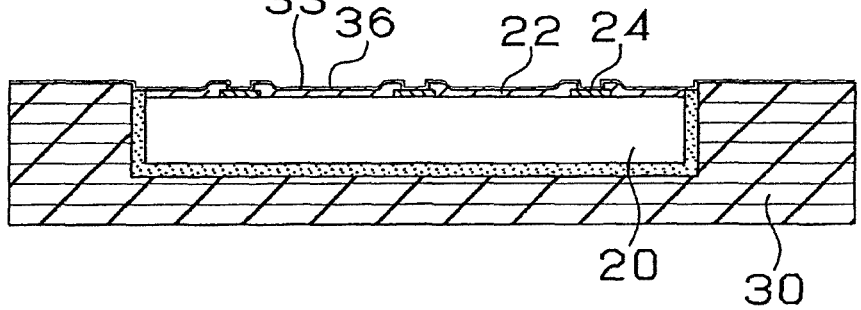
(B)
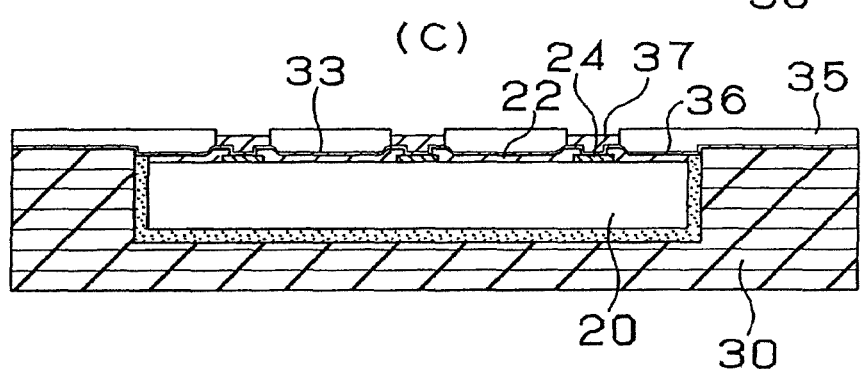
(C)
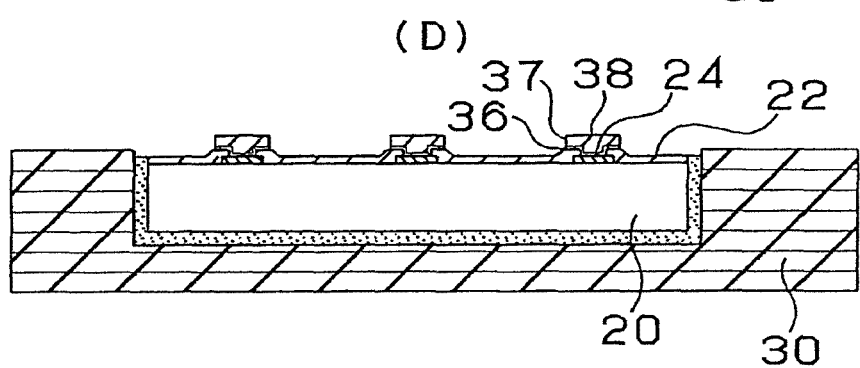
(D)

Fig. 3
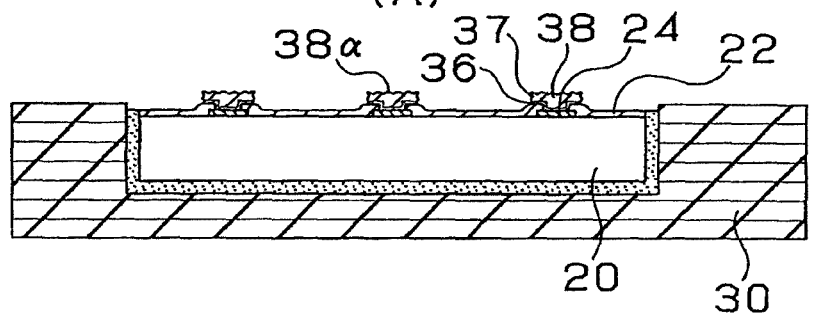
(A)
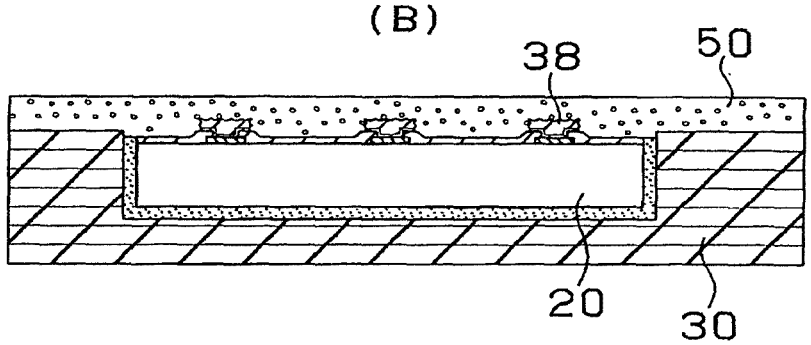
(B)
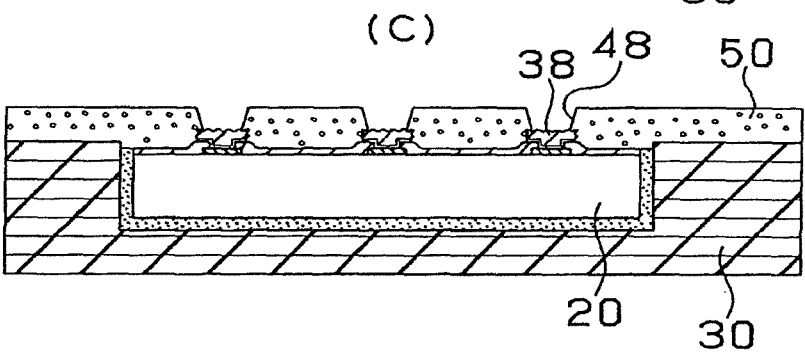
(C)
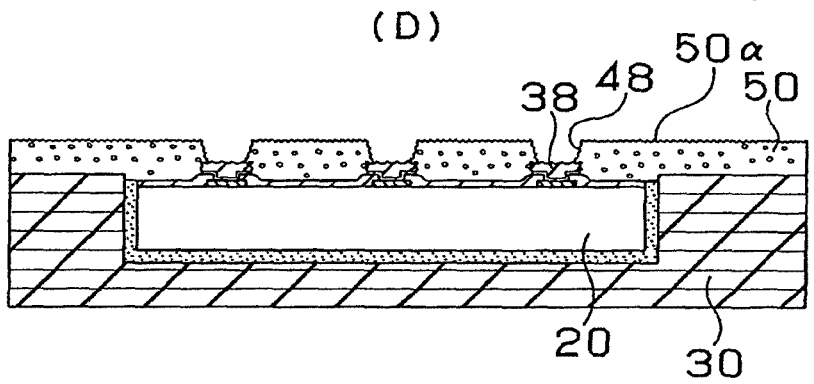
(D)

Fig. 4
(A)
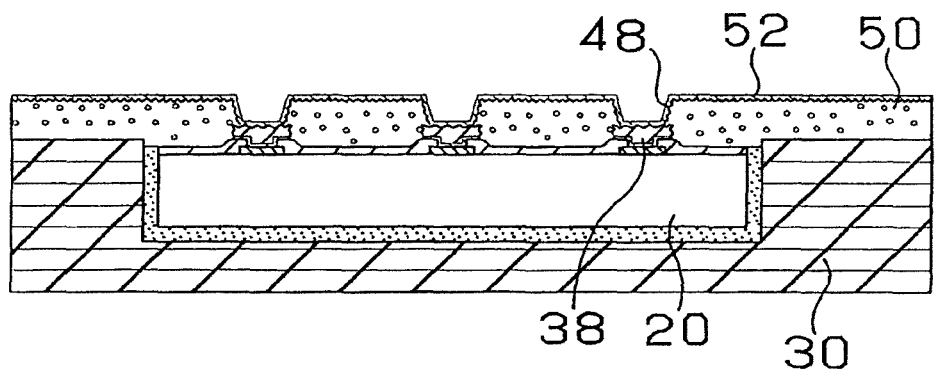
(B)
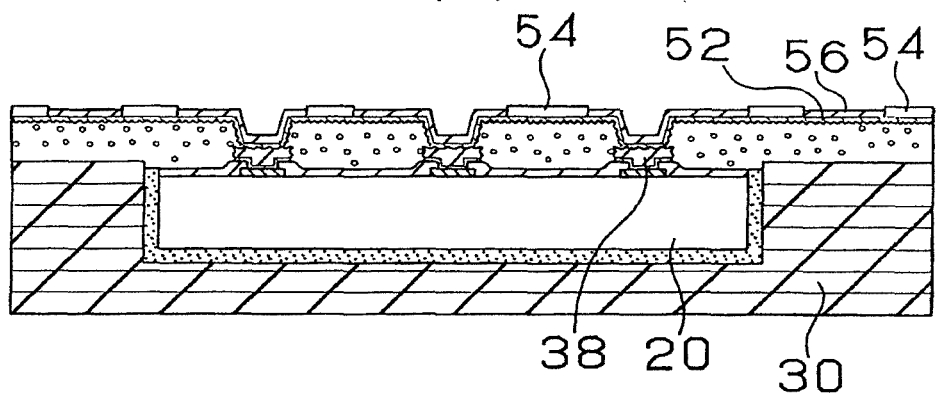
(C)
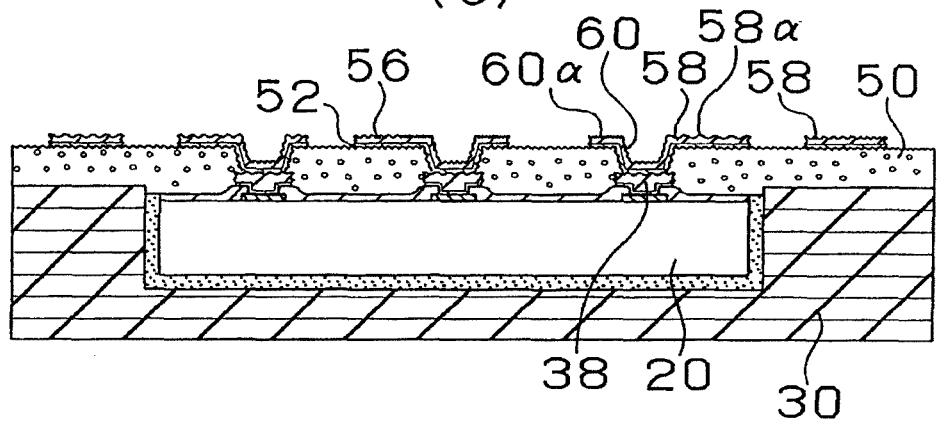

Fig. 5
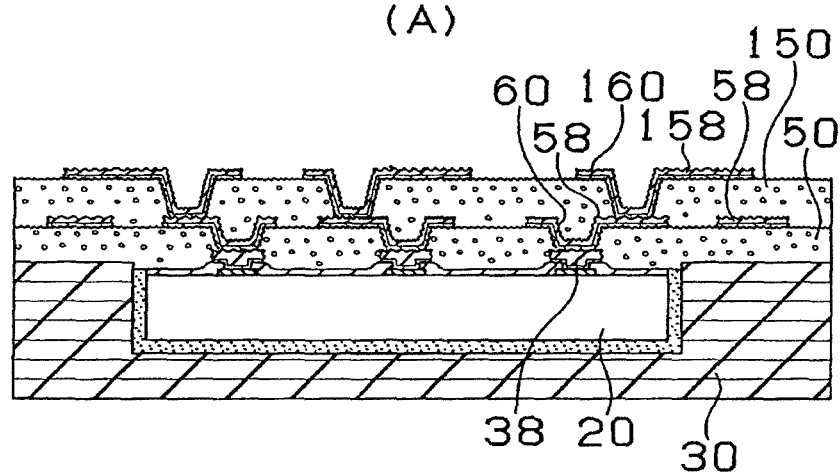
(A)
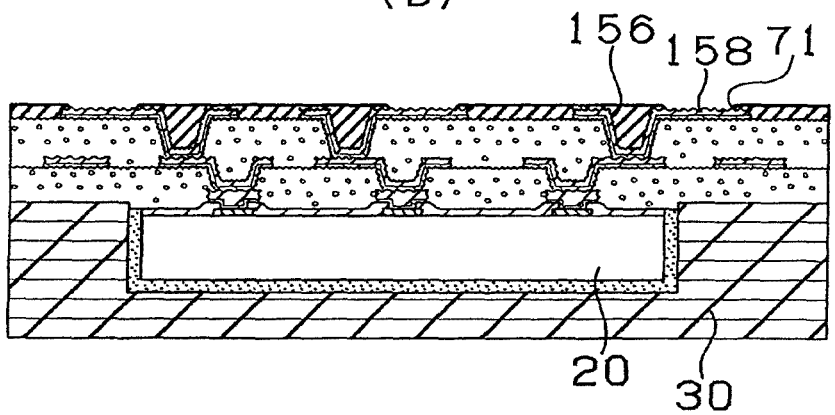
(B)
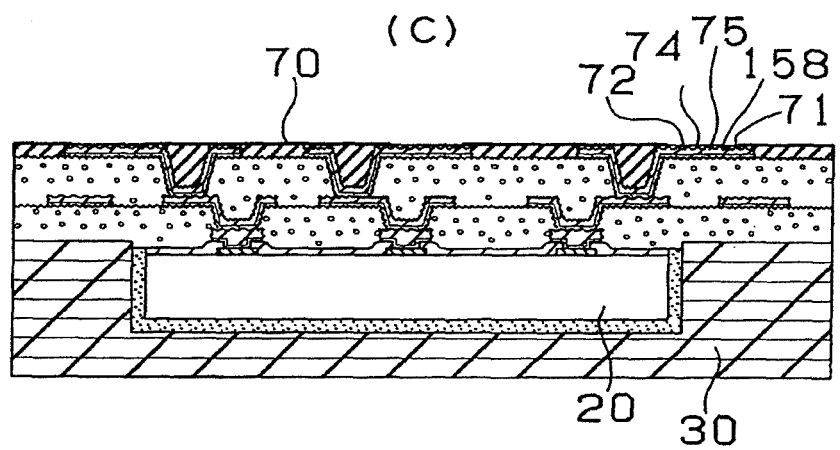
(C)

Fig. 7
(A)
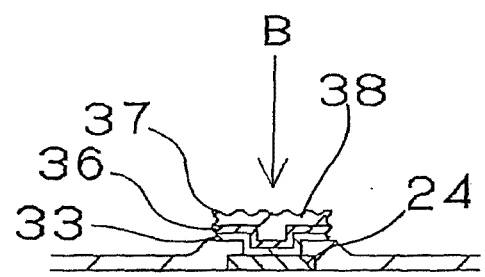
(B)
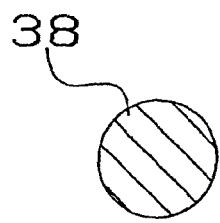
(C)
(D)
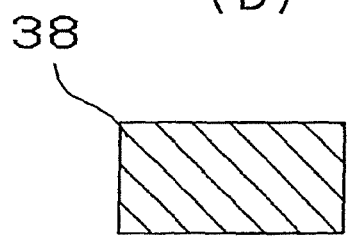
(E)
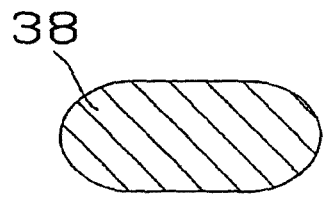

Fig. 8
(A)
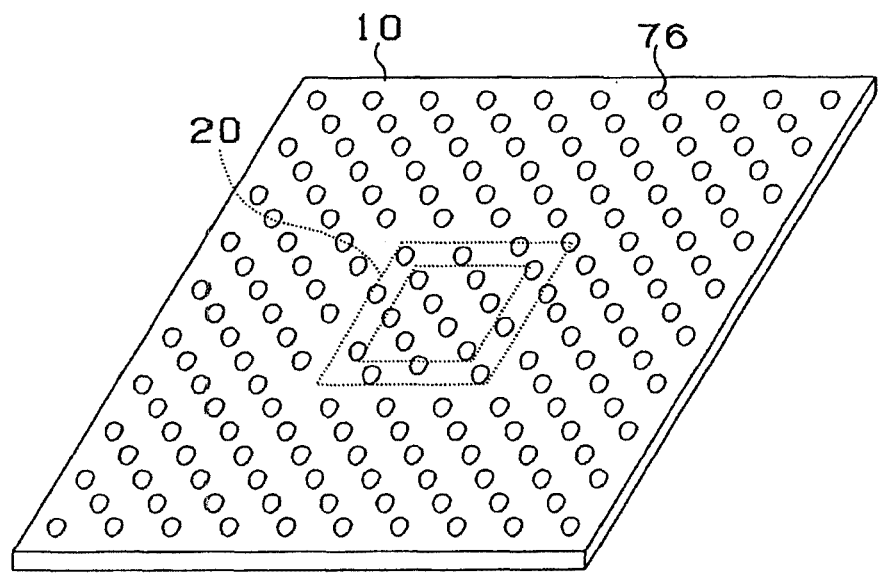
(B)
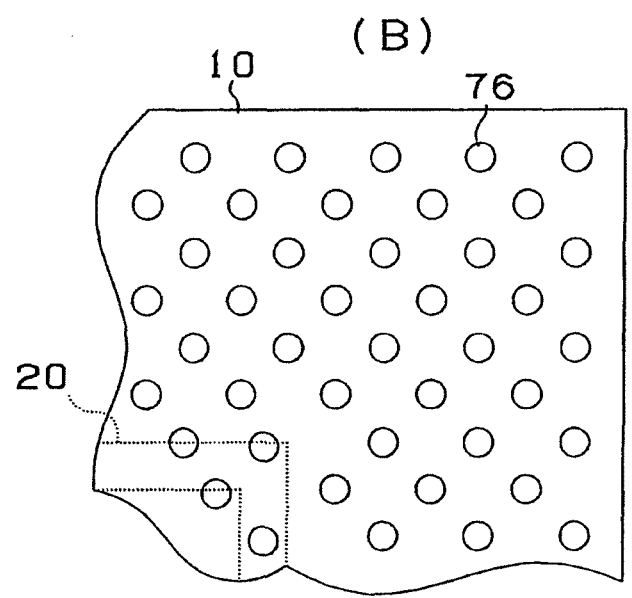

Fig. 9
(A)
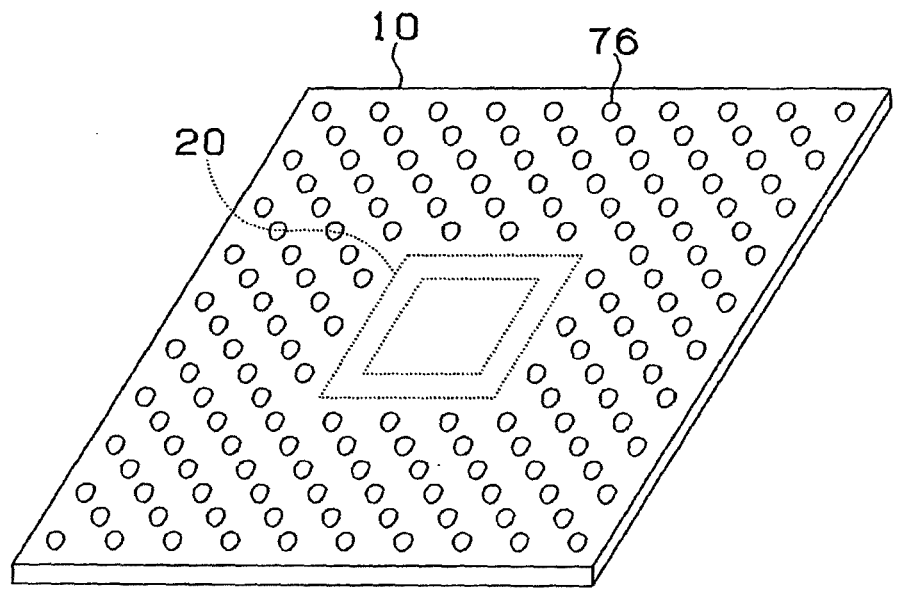
(B)
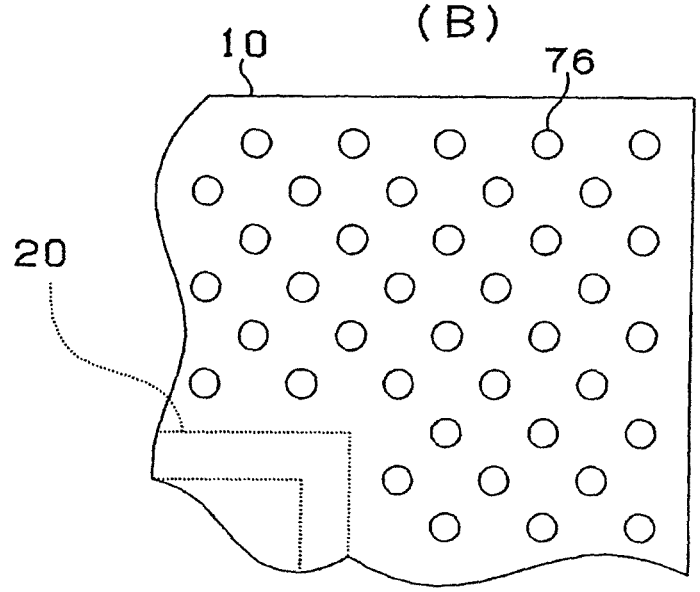

Fig. 14
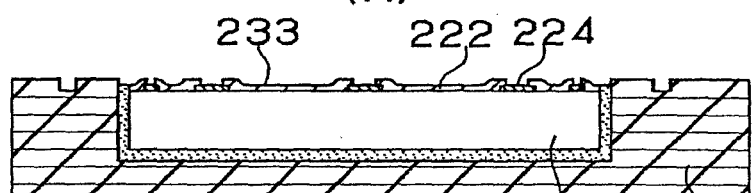
(A)
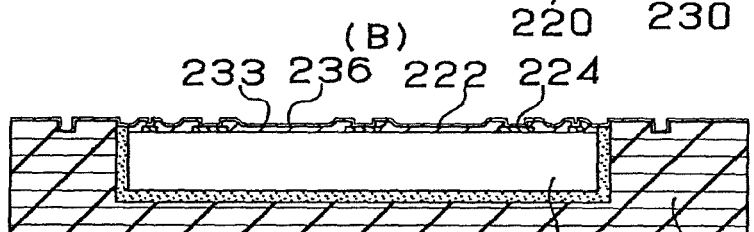
(B)
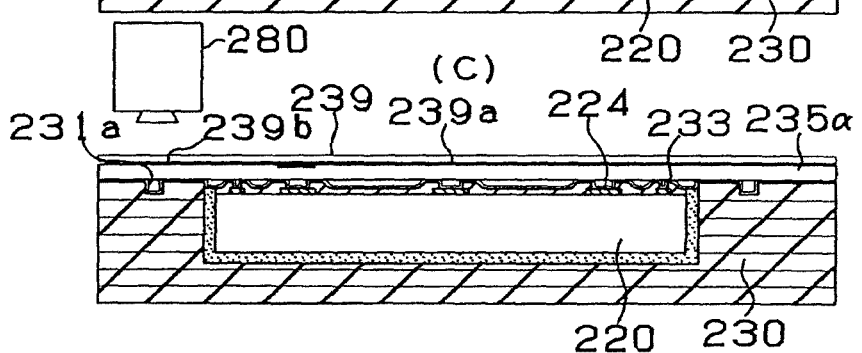
(C)
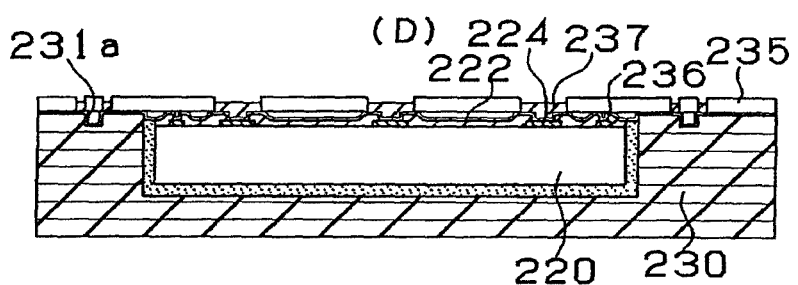
(D)
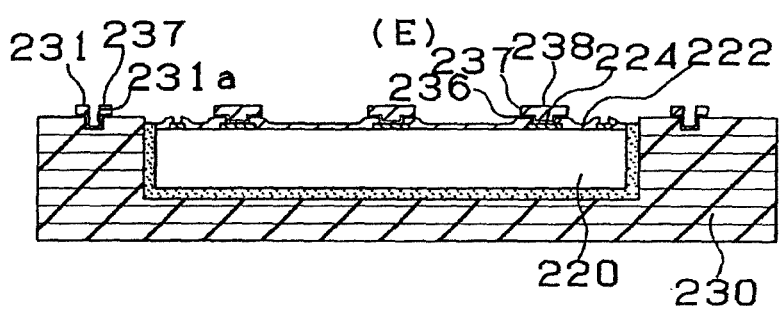
(E)

Fig. 19
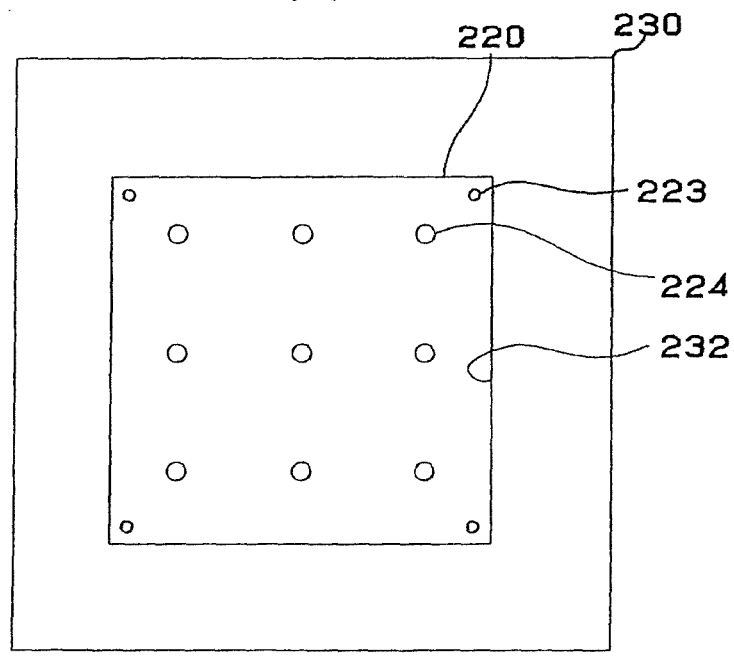
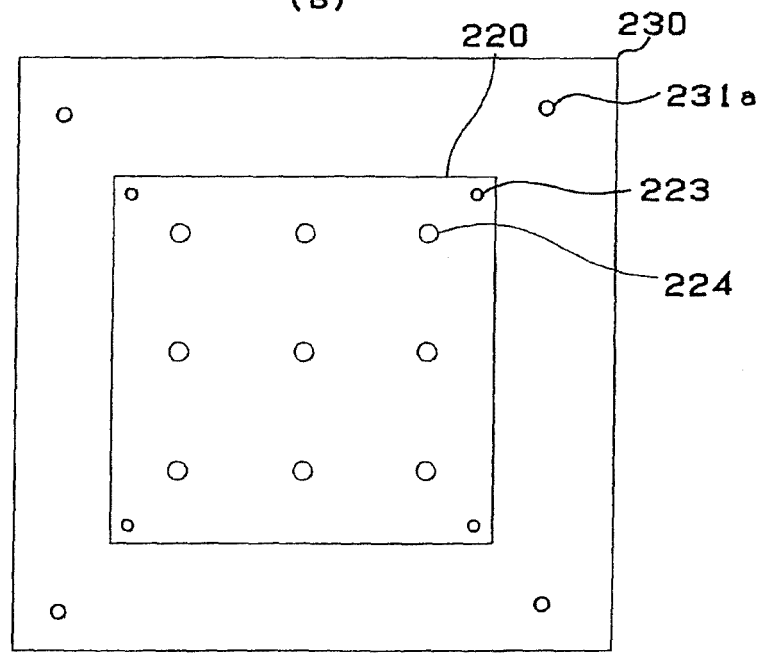

Fig. 20
(A)
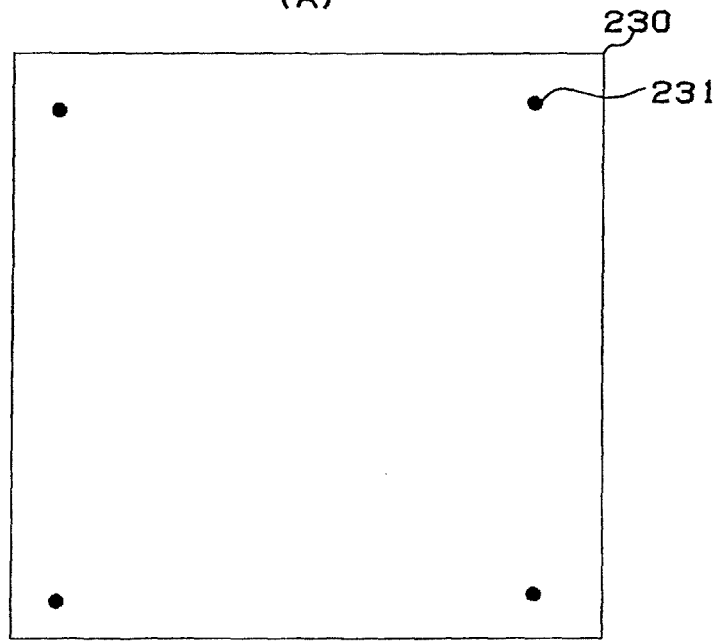
(B)
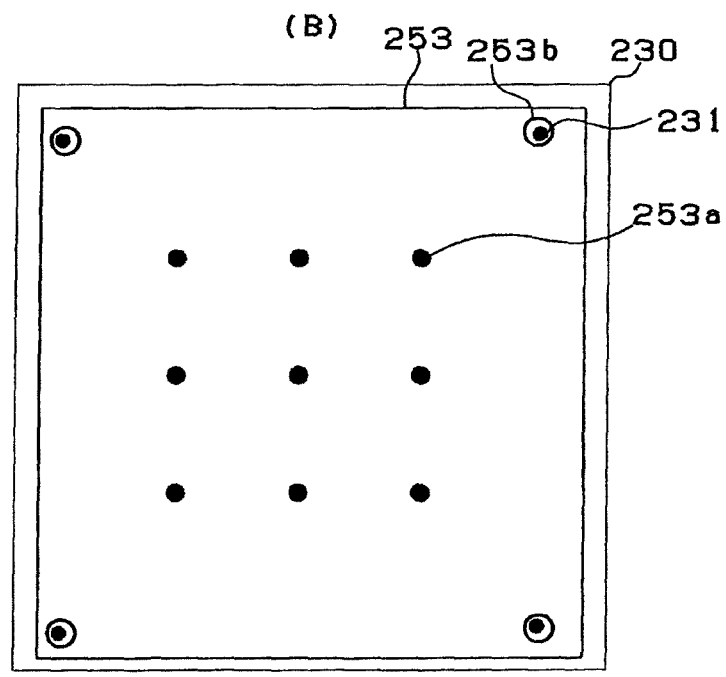

Fig. 22
(A)
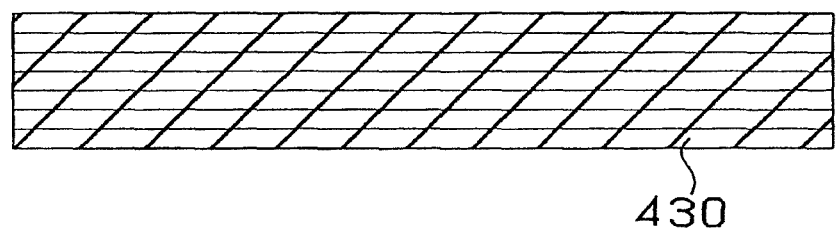
(B)
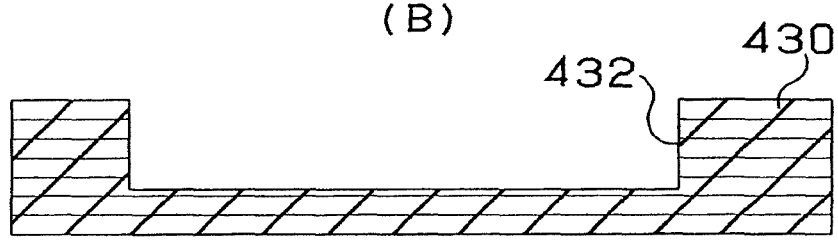
(C)
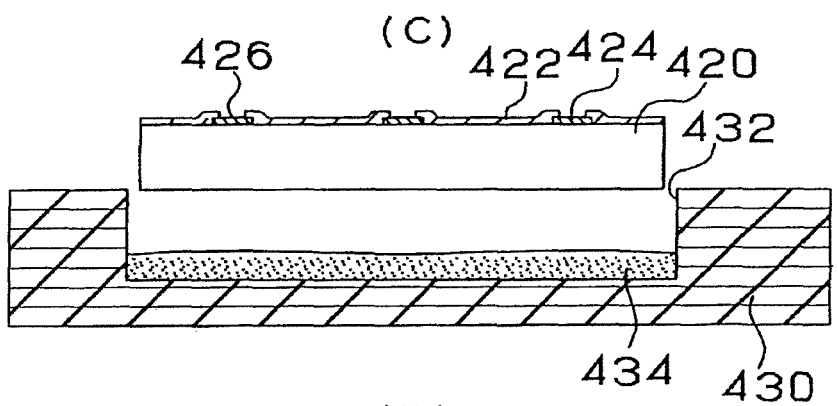
(D)
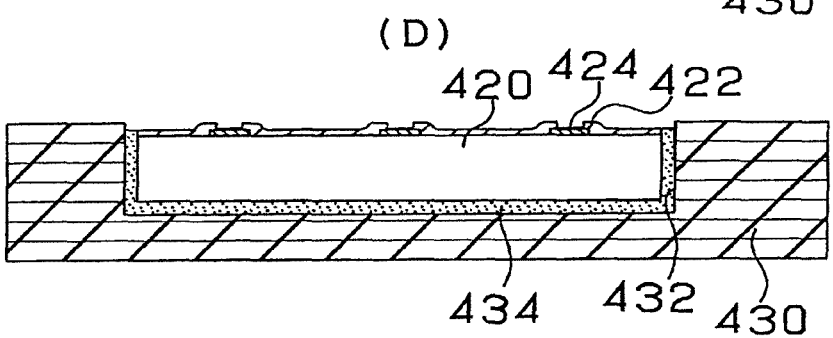

Fig. 23
(A)
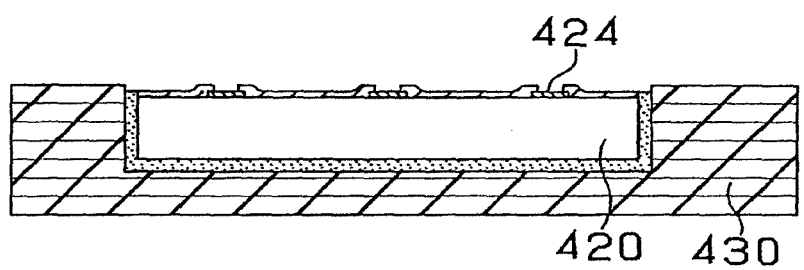
(B)
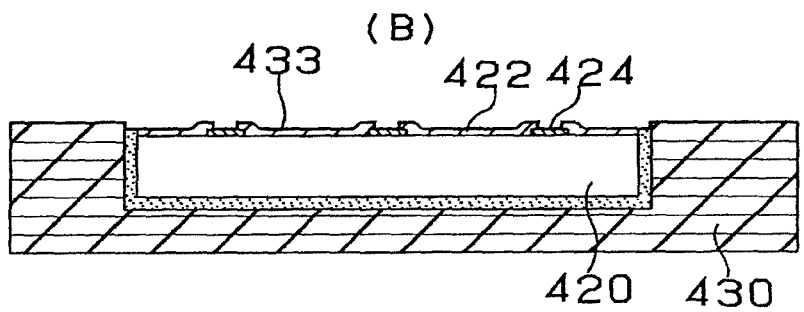
(C)
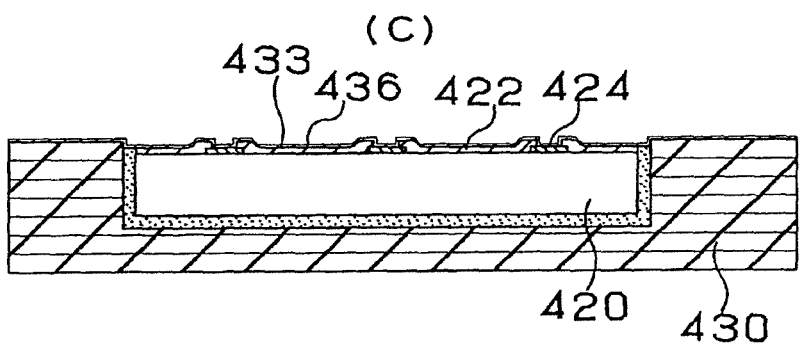
(D)
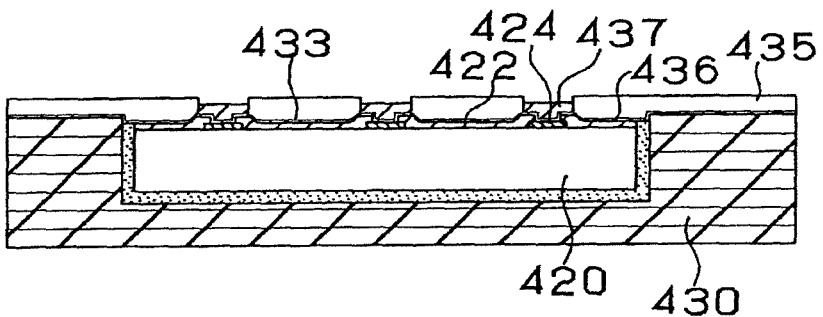

Fig. 24
(A)
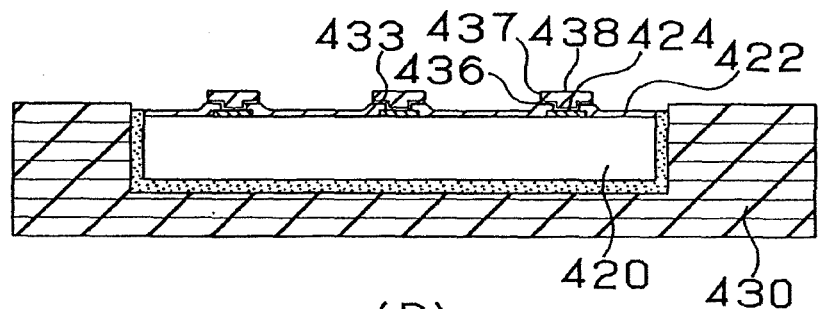
(B)
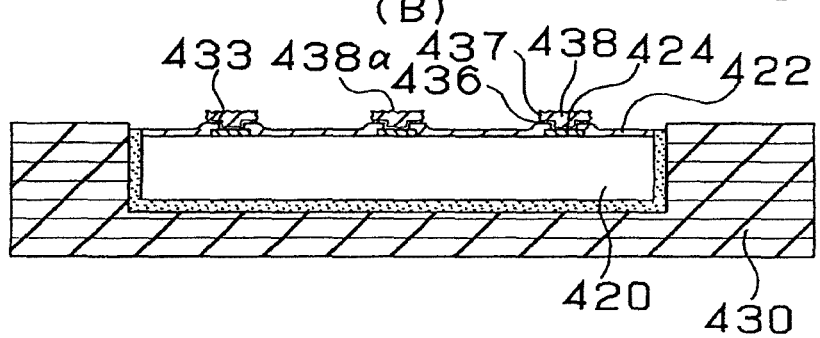
(C)
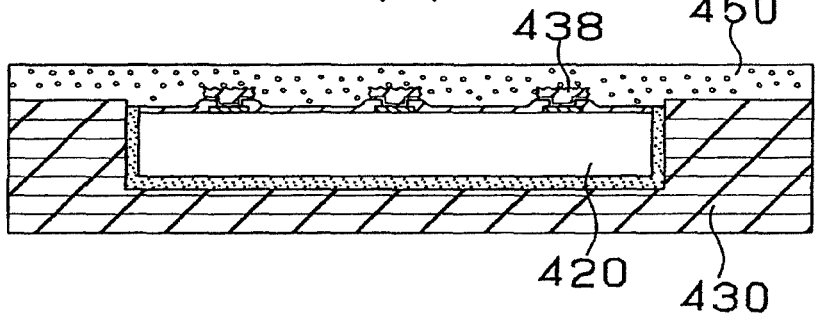
(D)
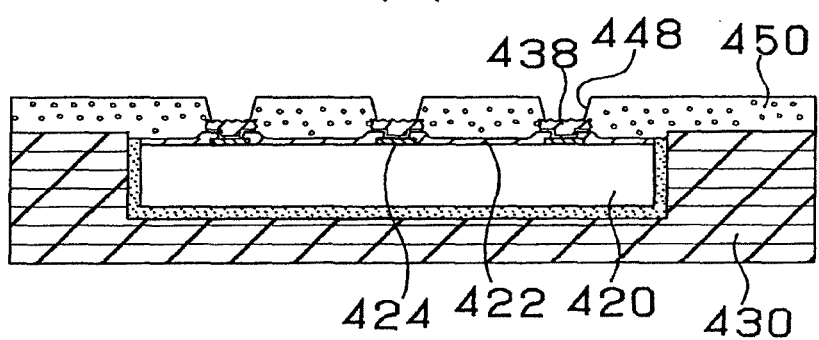

Fig. 25
(A)
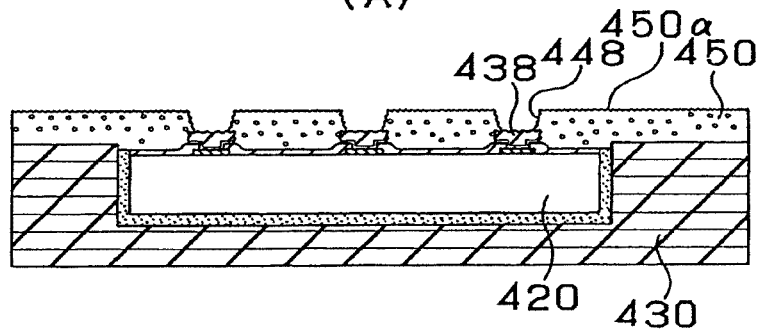
(B)
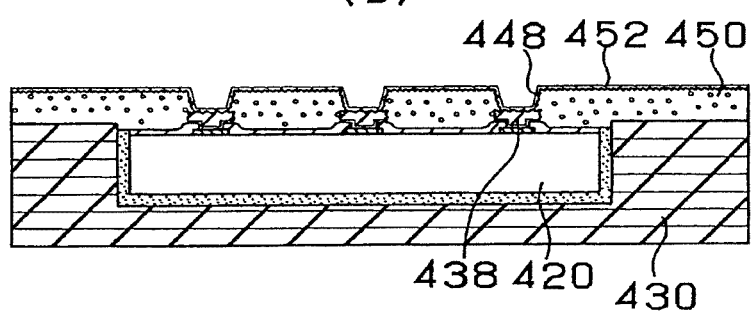
(C)
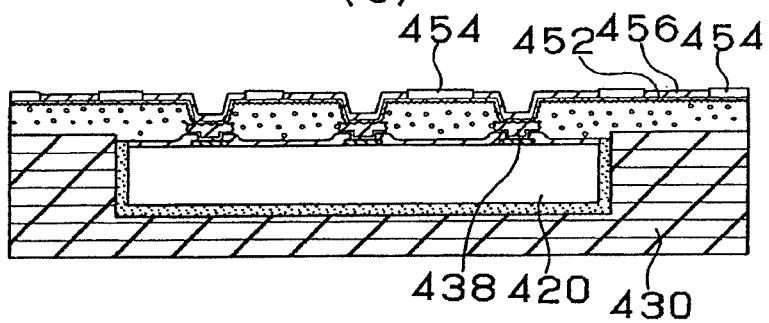
(D)
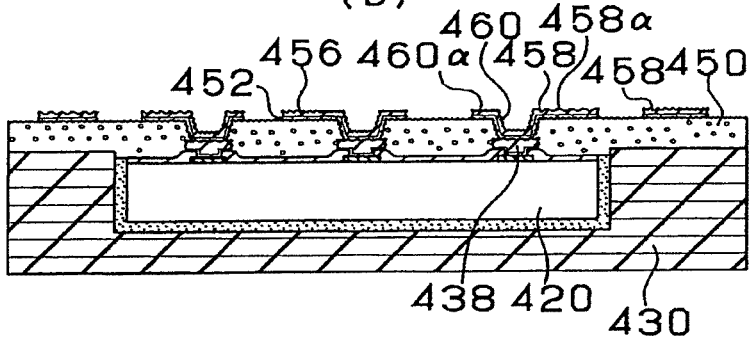

Fig. 27
(A)
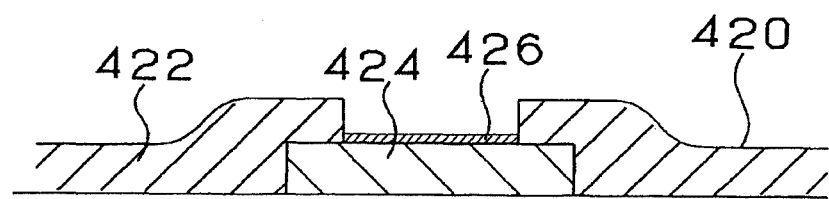
(B)
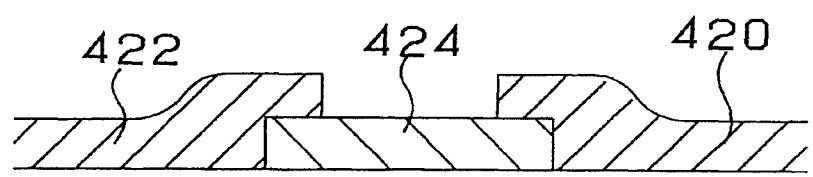
(C)
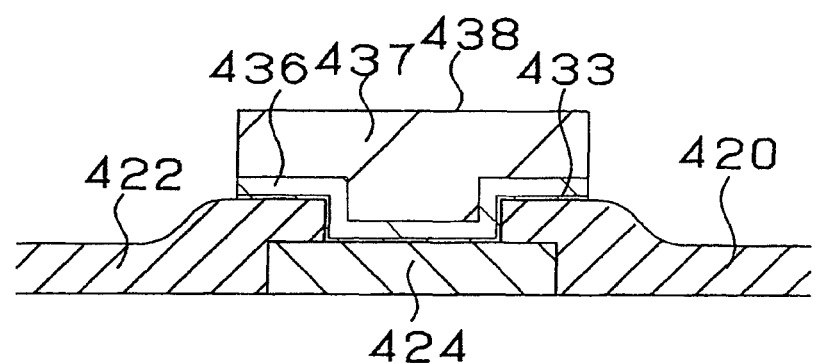

Fig. 29
(A)
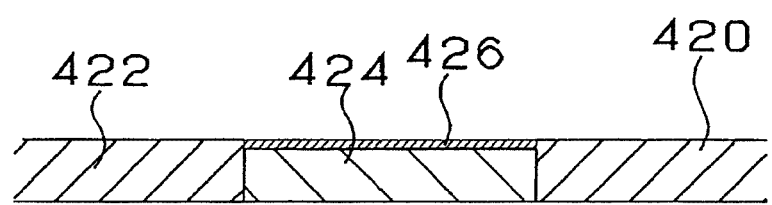
(B)
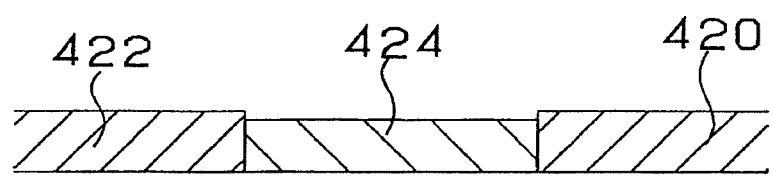
(C)
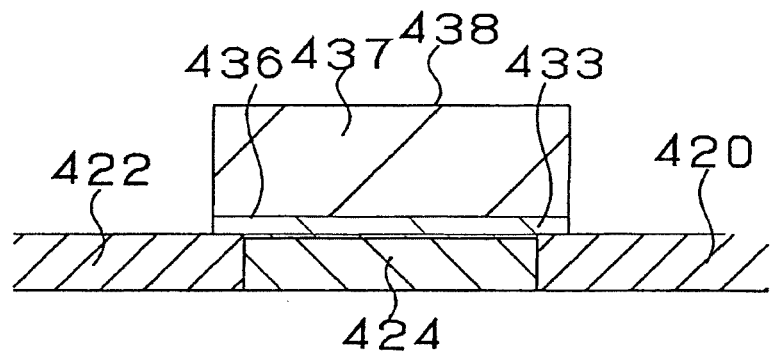

Fig. 30

Evaluation Result

| Classification | Item | Embodiment | Comparison Example |
|---|---|---|---|
| After Formation Of Transition | Whether Or Not Oxide Film Is Present | Not Present | Present |
| | Connection Resistance Value | 0.095ω | 14.6ω |
| After Reliability Test | Whether Or Not Oxide Film Is Present | Not Present | Present |
| | Whether Or Not Transition Is Separated | Not Present | Present |
| | Connection Resistance Value | 0.105ω | 17.8ω |

PRINTED CIRCUIT BOARD MANUFACTURING METHOD

CROSS-REFERENCE TO RELATED APPLICATIONS

This application is a continuation of and claims the benefit of priority to U.S. application Ser. No. 12/273,939, filed Nov. 19, 2008. U.S. application Ser. No. 12/273,939 is a continuation of U.S. application Ser. No. 12/103,414 filed Apr. 15, 2008, which is a divisional of U.S. application Ser. No. 10/793,515 filed Mar. 4, 2004, now U.S. Pat. No. 7,435,910, issued Oct. 14, 2008, which is a continuation of U.S. application Ser. No. 10/181,682, filed Jul. 17, 2002, now U.S. Pat. No. 6,909,054, issued Jun. 21, 2005, which is a National Stage, 35 USC 371, of International patent Application PCT/JP01/00177, filed Jan. 12, 2001. The entire contents of those applications are hereby incorporated herein by reference. This application further is based upon and claims the benefit of priority from the prior Japanese Patent Application Nos. 2000-152973, filed May 24, 2000, 2000-105212, filed Apr. 6, 2000, 2000-078206, filed Mar. 21, 2000, 2000-073558, filed Mar. 16, 2000, and 2000-049121, filed Feb. 25, 2000.

TECHNICAL FIELD OF THE INVENTION

The present invention relates to a buildup multilayer printed circuit board and particularly relates to a multilayer printed circuit board including electronic components such as an IC chip and a multilayer printed circuit board manufacturing method.

BACKGROUND OF THE INVENTION

An IC chip is electrically connected to a printed circuit board by a mounting method such as a wire bonding method, a TAB method or a flip-chip method.

In the wire bonding method, an IC chip is die-bonded to a printed circuit board by adhesive or the like, the pads of the printed circuit board are connected to the pads of the IC chip by wires such as metallic wires and then a sealing resin such as a thermosetting resin or a thermoplastic resin is applied to protect the IC chip and the wire.

In the TAB method, wires referred to as leads are connected in the block by a solder or the like and then the bumps of an IC chip and the pads of a printed circuit board are sealed by a resin.

In the flip-chip method, the pads of an IC chip are connected to the pads of a printed circuit board by through bumps and the gaps between the bumps and the respective pads are filled with a resin.

In each of these mounting methods, however, the IC chip and the printed circuit board are electrically connected to each other through lead members (wires, leads or bumps) for connection therebetween. These lead members tend to be cut off and eroded, making the connection of the printed circuit board to the IC chip cut off or causing malfunctions.

In addition, in each of these mounting methods, a sealing thermoplastic resin such as an epoxy resin is employed to protect the IC chip. However, if bubbles are contained at the time of filling the resin, then the lead members are broken, the IC pads are eroded and reliability of the IC chip is deteriorated due to the bubbles. To seal the IC chip or the like by a thermoplastic resin, it is required to create resin filling plungers and metallic molds in accordance with the respective components of the printed circuit board. Further, in case of employing a thermosetting resin, it is necessary to select a thermosetting resin in view of the materials of the lead members, a solder resist and the like, thereby disadvantageously causing cost increase.

SUMMARY OF THE INVENTION

The present invention has been made to solve the above-stated problems. It is an object of the present invention to propose a multilayer printed circuit board capable of being directly, electrically connected to an IC chip without using a lead member and a manufacturing method of the multilayer printed circuit board.

After being devoted to the intensive studies of the multilayer wiring board, the inventors of the present invention finally devised a structure capable of electrically connecting a multilayer printed circuit board to an IC chip without using leads and a sealing resin by providing opening portions, through holes and counterbore portions in the resin insulating substrate to thereby contain an electronic component such as an IC chip therein in advance, building up a plurality of interlayer insulating layers, providing via holes on the die pads of the IC chip by photoetching or laser, forming conductor circuits serving as conductive layers, and further providing the interlayer insulating layers and the conductive layers repeatedly to thereby provide the multilayer printed circuit board.

Moreover, the inventors of the present invention devised a structure of mounting an electronic component, such as an IC chip, on the surface layer of the multilayer printed circuit board by providing opening portions, through holes and counterbore portions in the resin insulating substrate to thereby contain an electronic component, such as an IC chip, therein in advance, building up interlayer insulating layers, providing via holes on the die pads of the IC chip by photo-etching or laser, then forming conductor circuits serving as conductive layers and further providing the interlayer insulating layers and the conductive layers repeatedly. With this structure, it is possible to electrically connect the multilayer printed circuit board to the IC chip in without using leads. It is also possible to mount the electronic components such as the IC chip having different functions and to obtain a multilayer printed circuit board having a greater function. To be specific, a cache memory is embedded as the IC chip included in the board and an IC chip having an operation function is mounted on the front surface of the multilayer printed circuit board, whereby it is possible to arrange the IC chip and the cache memory in proximity while separately manufacturing the cache memory having low yield and the IC chip.

Furthermore, after being devoted to the intensive studies, the inventor of the present invention devised providing opening portions, through holes and counterbore portions in resin insulating substrate to thereby contain an electronic component such as an IC chip in advance and forming a transition layer consisting of at least two-layer structure on the die pad of the IC chip. An interlayer insulating layer is provided on the transition layer and a via hole is provided on a via hole which is the transition layer of the IC chip by photo-etching or laser and a conductor circuit serving as a conductive layer. Thereafter, interlayer insulating layers and conductive layers are repeatedly built up and a multilayer printed circuit board is provided, thereby making it possible to electrically connect the multilayer printed circuit board to the IC chip without using a sealing resin and leads. Further, since the transition layer is formed on the IC chip portion, the IC % chip portion is flattened. Accordingly, the upper interlayer insulating layer is flattened and the thickness thereof becomes uniform. Further, the transition layer makes it possible to maintain the stability of a shape in case of forming the via hole on the upper layer.

The reasons for providing the transition layer on the pad of the IC chip are as follows. First, if the die pad becomes fine pitch and small in size, alignment at the time of forming via holes becomes difficult. Due to this, by providing a transition layer, the alignment is facilitated. If the transition layer is provided, buildup layers can be stably formed even while a die pad pitch is 150 μm or less and a pad size is 20 μm or less. If the via hole is formed in the interlayer insulating layer with the die pad on which the transition layer is not formed and the diameter of the via is larger than the diameter of the die pad, then a polyimide layer serving as the protective layer of the surface of the die pad is dissolved and damaged at the time of removing the residue on the bottom of the via and roughening the surface of the interlayer resin insulating layer. On the other hand, if laser is applied and the via diameter is larder than the diameter of the die pad, a polyimide layer (or protective layer of the IC) is damaged by the laser. Moreover, if the die pad of the IC chip is very small and the diameter of the via is larger than the size of the die pad, then positioning becomes quite difficult even by photo-etching or laser and connection errors occur between the die pad and the via hole.

By providing the transition layer on the die pad, by contrast, it is possible to ensure connecting the via on the die pad even with a die pad pitch of 150 μm or less and a pad size of 20 μm or less, thereby improving the connection between the pad and the via and reliability. In addition, by interposing the transition layer having a larger diameter on the pad of the IC chip, the fear that the protective film of die pad and the IC are dissolved and damaged if the protective film is immersed in an acid or an etching solution in later steps such as a de-smear and plating steps or conducting various annealing steps, is eliminated.

The multilayer printed circuit board itself fulfils the functions. In some cases, BGA's, solder bumps or PGA's (conductive connection pins) may be provided to connect to a mother board or a daughter board which is an external board so as to function as a package substrate for a semiconductor device. With this constitution, wiring length and loop inductance can be reduced compared with a case of connecting the multilayer wiring board to the external board by a conventional mounting method.

Now, the transition layer defined in the present invention will be described.

The transition layer means a mediate layer provided on an intermediate portion so as to directly connect the IC chip, which is a semiconductor element, to the printed circuit board without using a conventional IC chip mounting technique. The transition layer is characterized by being formed out of two or more metallic layers or by being made larger than the die pad of the IC chip which is the semiconductor element. The transition layer thus characterized enables the enhancement of electrical connection and positioning characteristics and via hole processing by means of laser or photo-etching without damaging the die pad. This can ensure embedding and containing the IC chip in the printed circuit board, and connecting the IC chip to the printed circuit board. This also enables a metallic layer serving as the conductive layer of the printed circuit board to be directly formed on the transition layer. For example, the conductive layer is the via hole of the interlayer resin insulating layer or a through hole on the substrate.

As a resin substrate for including electronic components such as the IC chip therein used in the present invention, a substrate obtained by building up prepregs impregnated with a resin or a glass epoxy resin obtained by impregnating an epoxy resin, a BT resin, a phenol resin or the like with a reinforcement or a core material such as a glass epoxy resin. An ordinary resin substrate used for the printed circuit board may be used. Alternatively, a double-sided copper-clad laminate, a one-sided plate, a resin plate without a metallic film or a resin film may be used. However, if the resin is heated at 350° C. or higher, the resin is dissolved and carbonated. Further, ceramic cannot be used for the substrate since it is inferior in outside workability.

The IC chip is coupled to a resin insulating substrate such as a core substrate in which a cavity formed as a counterbore, a through hole or an opening for containing an electronic component such as the IC chip, by an adhesive or the like.

The entire surface of the core substrate including the IC chip is subjected to deposition, sputtering or the like, thereby forming a conductive metallic film (or first thin film layer) on the entire surface. The metal used may be tin, chromium, titanium, nickel, zinc, cobalt, gold, copper or the like. The thickness of the conductive metallic film is preferably between 0.001 and 2.0 μm. If the thickness is smaller than 0.001 μm, the conductive metallic film cannot be provided uniformly on the entire surface. It is difficult to form a conductive metallic film having a thickness exceeding 2.0 μm and even if formed, the film does not improve advantages. The thickness is more preferably between 0.01 and 1.0 μm. If chromium is used, the thickness is preferably 0.1 μm.

The first thin film layer covers the die pad, thereby making it possible to improve the adhesiveness of the transition layer and the IC chip to an interface with the die pad. Further, by covering the die pad with such a metal, it is possible to prevent the entry of moisture into the interface, to prevent the dissolution and erosion of the die pad and to improve reliability. In addition, the first thin film layer allows the connection between the multilayer printed circuit board and the IC chip by a mounting method without using leads. If using chromium, nickel or titanium, it is possible to prevent the entry of moisture into the interface and excellent metal adhesiveness is ensured. The thickness of chromium, titanium or the like is set so that the sputtered layer does not crack and that adhesiveness between the metal and the upper layer is ensured. With a reference to a positioning mark on the IC chip, a positioning mark is formed on the core substrate.

The second thin film layer is formed on the first thin film layer by sputtering, deposition or electroless plating. The metal used is exemplified by nickel, copper, gold, silver or the like. It is preferable to use copper because it has appropriate electrical characteristic and is economical and a thickening layer formed in a later step mainly consists of copper.

The reason for providing the second thin film layer is that only the first thin film layer cannot provide a electroplating lead to form a thickening layer to be described later. The second thin film layer 36 is employed as a thickening lead. The thickness of the second thin film is preferably 0.01 to 5 μm. If the thickness is smaller than 0.01 μm, the second thin film layer cannot function as a lead. If the thickness exceeds 5 μm, the lower first thin film layer is cut more than the second thin film layer to thereby generate gaps, moisture tends to enter the interference and reliability deteriorates during etching.

The second thin film layer is thickened by electroless plating or electroplating. The type of a metal formed is exemplified by copper, nickel, gold, silver, zinc, iron or the like. It is preferable to use copper for electroplating because copper has appropriate electrical characteristic, is economical, has the strength and structural resistance of the transition layer and a conductor layer to be build up in a later step mainly consists of copper. The thickness of the second thin film layer is preferably 1 to 20 μm. If the thickness is smaller than 1 μm, the connection reliability of the layer with the upper via hole deteriorates. If the thickness exceeds 20 μm, undercut occurs during etching and thereby gaps are generated in the interface between the formed transition layer and the via hole. In some cases, the first thin film layer may be directly plated to thicken the layer or multiple layers may be provided.

Thereafter, an etching resist is formed with reference to the positioning mark on the core substrate, exposure and development are performed to expose the portions of the metal other than that of the transition layer and etching is then performed, thereby forming a transition layer consisting of the first thin film layer, the second thin film layer and a thickening layer on the die pad of the IC chip.

In case of forming a transition layer by a subtractive process, a metallic film is thickened by electroless plating or electroplating. The type of the plated member to be formed is exemplified by copper, nickel, gold, silver, zinc, iron or the like. It is preferable to use copper because copper has appropriate electrical characteristic and is economical and a buildup conductive layer to be formed later mainly consists of copper. The thickness is preferably in the range of 1 to 20 μm. If the thickness exceeds the range, undercut occurs during etching and gaps may be generated in the interface between the transition layer and the via hole to be formed. Thereafter, an etching resist is formed, exposure and development are performed to the portion of the metal other than that of the transition layer, thereby forming a transition layer on the pad of the IC chip.

As stated above, the inventors of the present invention devised including an IC chip in a package substrate by containing the IC chip in a recess formed in the core substrate and building up an interlayer resin insulating layer and a conductive circuit on the core substrate.

According to this method, a metallic film is formed on the entire surface of the core substrate containing the IC chip so as to cover or protect the pad of the IC chip, or, in some cases, forming a transition layer on the pad, thereby electrically connecting the pad to the via hole of the interlayer resin insulating layer.

However, since the metallic film is formed on the entire surface, a positioning mark formed on the IC chip is concealed and a mask on which wirings are drawn or a laser device cannot be positioned relative to the substrate. Due to this, it is estimated that a positional error occurs between the pad on the IC chip and the via hole and that electrical connection cannot be established between the pad and the via hole.

The present invention has been made to solve the above-stated problems. It is another object of the present invention to propose a method of a multilayer printed circuit board manufacturing method capable of being appropriately connected to an IC chip included in the multilayer printed circuit board.

According to claim 14, a method of manufacturing a multilayer printed circuit board having interlayer insulating layers and conductor layers repeatedly formed on a substrate, via holes formed in the interlayer insulating layers, and establishing electrical connection through the via holes, is characterized by comprising at least the following steps (a) to (c):
(a) containing an electronic component in said substrate;
(b) forming a positioning mark on said substrate based on a positioning mark of said electronic component; and
(c) conducting working or formation based on the positioning mark of said substrate.

According to claim 14, a positioning mark is formed on a substrate containing an electronic component therein based on the positioning mark of the electronic component, and working or formation is conducted based on the positioning mark of the substrate. Due to this, it is possible to form a via hole in an interlayer resin insulating layer on the substrate so as to accurately match the position of the via hole to the position of the electronic component.

Working in this case means the IC chip which is the electronic component or all that formed on the substrate. For example, a transition layer on the pad of the IC chip, a recognized character (e.g., an alphabet, number or the like), a positioning mark are included.

Also, formation in this case means all that formed on the interlayer resin insulating layer (which does not contain a reinforcement such as glass cloths) provided on the core substrate. For example, a via hole, a wiring, a recognized character (e.g., an alphabet, number or the like), a positioning mark and the like are included.

According to claim 15, a method of manufacturing a multilayer printed circuit board having interlayer insulating layers and conductor layers repeatedly formed on a substrate, via holes formed in the interlayer insulating layers, and establishing electrical connection through the via holes, is characterized by comprising at least the following steps (a) to (d):
(a) containing an electronic component in said substrate;
(b) forming a positioning mark on said substrate based on a positioning mark of said electronic component by using laser;
(c) forming a metallic film on the positioning mark of said substrate; and
(d) conducting working or formation based on the positioning mark of said substrate.

According to claim 15, a positioning mark is provided on a substrate containing an electronic component therein by laser based on the positioning mark of the electronic component, working or formation is conducted based on the positioning mark of the substrate after forming a metallic film on the positioning mark provided by laser. Due to this, it is possible to form a via hole in the interlayer insulating layer on the substrate so as to accurately match the position of the via hole to the position of the electronic component. In addition, since the metallic film is formed on the positioning mark provided by laser, it is possible to easily recognize the positioning mark by a reflection method and to conduct accurate positioning.

According to claim 16, a method of manufacturing a multilayer printed circuit board having interlayer insulating layers and conductor layers repeatedly formed on a substrate, via holes formed in the interlayer insulating layers, and establishing electrical connection through the via holes, is characterized by comprising at least the following steps (a) to (e):
(a) containing an electronic component in said substrate;
(b) forming a positioning mark on said substrate based on a positioning mark of said electronic component by using laser;
(c) forming a metallic film on the positioning mark of said substrate;
(d) forming the interlayer insulating layers on said substrate; and
(e) processing or forming via hole openings in said interlayer resin insulating layers based on the positioning mark of said substrate.

According to claim 16, a positioning mark is formed on a substrate containing an electronic component therein based on the positioning mark of the electronic component, working or formation is conducted based on the positioning mark of the substrate after forming a metallic film on the positioning mark. Due to this, it is possible to form a via hole in an interlayer insulating layer on the substrate so as to accurately match the position of the via hole to the position of the electronic component. In addition, the metallic film is formed on the positioning mark provided by laser. Due to this, even if an interlayer insulating layer is formed on the positioning mark, the positioning mark can be easily recognized and accurate positioning can be conducted by recognizing an image by a reflection method.

As described above, the inventor of the present invention devised a structure capable of establishing electrical connection between a multilayer printed circuit board and an IC chip without using a sealing resin, leads or bumps by providing an opening portion, a through hole or a counterbore portion in a resin insulating substrate to include an electronic component such as an IC chip therein, building up interlayer resin insulating layers, providing a via on the pad of the IC chip by photo-etching or laser, forming a conductor circuit serving as a conductive layer, repeatedly providing the interlayer insulating layers and the conductive layers and thereby forming the multilayer printed circuit board.

However, since the pad of the IC chip is normally formed out of aluminum or the like, the pad is oxidized in manufacturing steps and an oxide film is formed on the surface of the pad. Due to this, it was discovered, the oxide film formed on the surface causes an increase in the connection resistance of the pad and, the multilayer printed circuit board cannot be appropriately electrically connected to the IC chip. It was also discovered that if an oxide film remains on the die pad, the adhesiveness between the pad and the transition layer becomes insufficient and reliability cannot be satisfied.

The present invention has been made to solve the above-stated problems. It is a still further object of the present invention to propose a multilayer printed circuit board capable of being appropriately electrically connected to an IC chip without leads and a method of manufacturing the multilayer printed circuit board.

According to claim 17, in order to achieve the above purpose, a method of manufacturing a multilayer printed circuit board is characterized by comprising at least the following steps (a) to (e):
(a) containing an electronic component in said substrate;
(b) removing a film on a surface of a die pad of said electronic component;
(c) forming a transition layer to be connected to a via hole of a lowermost interlayer insulating layer, on said die pad;
(d) forming the interlayer insulating layers on said substrate; and
(e) forming the via holes connected to the conductor circuits and the transition layers, in said interlayer resin insulating layers.

According to claim 17, since an IC chip is contained in a substrate, the multilayer printed circuit board can be electrically connected to the IC chip without leads. Besides, an oxide film removal process is conducted to the connection surface of the die pad of an electronic component such as an IC chip, it is possible to reduce the electrical resistance of the die pad and to improve electrical conductivity thereof. Further, by proving a transition layer on an IC chip portion, the IC chip portion is flattened. Due to this, the interlayer insulating layer on the IC chip is also flattened and film thickness becomes uniform. Furthermore, if a via hole on an upper layer is formed, it is possible to maintain the stability of shape. It is preferable that the film is completely removed.

According to claim 18, by completely removing the oxide film by one of inverse sputtering and a plasma process, it is possible to improve the electrical conductivity of the die pad of the IC chip.

In case of inverse sputtering, inactive gas such as argon gas is used as sputtering gas and inverse sputtering is conducted to the oxide film on the surface of the die pad, thereby completely removing the oxide film. In case of the plasma process, the substrate is put in a device in a vacuum state, plasmas are discharged in oxygen or nitrogen, carbon dioxide and carbon tetrafluoride to thereby remove the oxide film on the surface of the die pad.

According to claim 19, the film removal and the formation of the lower most layer of the transition layer are conducted under a non-oxygen atmosphere in succession. Due to this, it is possible to improve the electrical conductivity and adhesiveness between the die pad of the IC chip and the transition layer without forming an oxide film on the surface of the pad again.

According to claim 20, a multilayer printed circuit board having interlayer insulating layers and conductor layers repeatedly formed on a substrate, via holes formed in the interlayer insulating layers, and establishing electrical connection through the via holes, is characterized in that
an electronic component is included in said substrate;
a transition layer to be connected to a via hole of a lowermost interlayer insulating layer is formed on a die pad of said electronic component; and
a film on a surface of said die pad is removed.

According to claim 20, since the IC chip is contained in the substrate, the multilayer printed circuit board can be electrically connected to the IC chip without leads. Further, since an oxide film removal process is conducted to the connection surface of the die pad of an electronic component such as an IC chip, it is possible to reduce the electrical resistance of the die pad and improve the electrical conductivity thereof. Further, by providing the transition layer on the IC chip portion, the IC chip portion is flattened. Due to this, the interlayer insulating layer on the IC chip is also flattened and film thickness becomes uniform. In addition, even if a via hole on the upper layer is formed, it is possible to maintain the stability of shape. It is preferable that the film is completely removed.

BRIEF DESCRIPTION OF THE DRAWINGS

FIG. 1 is a diagram showing a process for manufacturing a multilayer printed circuit board in the first embodiment according to the present invention;

FIG. 2 is a diagram showing a process for manufacturing the multilayer printed circuit board in the first embodiment;

FIG. 3 is a diagram showing a process for manufacturing the multilayer printed circuit board in the first embodiment;

FIG. 4 is a diagram showing a process for manufacturing the multilayer printed circuit board in the first embodiment;

FIG. 5 is a diagram showing a process for manufacturing the multilayer printed circuit board in the first embodiment;

FIG. 7(A) is a drawing showing an enlarged transition layer shown in FIG. 3(A), FIG. 7(B) is a diagram seen from B of FIG. 7(A) and FIGS. 7(C), (D) and (E) are explanatory views for modifications of the transition layer;

FIG. 8(A) is a perspective view of the multilayer printed circuit board in the first embodiment, and FIG. 8(B) is an explanatory view for the multilayer printed circuit board which is partly enlarged;

FIG. 9(A) is a perspective view of a multilayer printed circuit board in the first modification of the first embodiment, and FIG. 9(B) is an explanatory view for the multilayer printed circuit board which is partly enlarged;

FIG. 14 is a diagram showing a process for manufacturing a multilayer printed circuit board in the second embodiment;

FIG. 19(A) is a plan view of a core substrate shown in FIG. 13(D), and FIG. 19(B) is a plan view of FIG. 13(E);

FIG. 20(A) is a plan view of the core substrate before a photomask film is mounted, and FIG. 20(B) is a plan view of the core substrate in a state in which the photomask film is mounted;

FIG. 22 is a diagram showing a process for manufacturing a multilayer printed circuit board in the third embodiment;

FIG. 23 is a diagram showing a process for manufacturing the multilayer printed circuit board in the third embodiment;

FIG. 24 is a diagram showing a process for manufacturing the multilayer printed circuit board in the third embodiment;

FIG. 25 is a diagram showing a process for manufacturing the multilayer printed circuit board in the third embodiment;

FIG. 27(A) is an enlarged, explanatory view for a die pad portion shown in FIG. 22(C), FIG. 27(B) is an enlarged, explanatory view for a die pad portion shown in FIG. 23(A), and FIG. 27(C) is an enlarged, explanatory view for a die pad portion shown in FIG. 24(A);

FIGS. 29(A), (B) and (C) are drawings showing an enlarged die pad portion in the first modification of the third embodiment, wherein FIG. 29(A) shows a state before an oxide film removal process, FIG. 29(B) shows a state after the oxide film removal process and FIG. 29(C) shows a state after a transition layer is formed on a die pad; and FIG. 30 is a table showing results of evaluating the multilayer printed circuit board in the third embodiment and the multilayer printed circuit board in a comparison example with respect to four items of 1) sectional state, 2) resistance measurement value, 3) sectional state after a reliability test, and 4) resistance measurement value.

BEST MODES FOR WORKING THE INVENTION

The embodiments of the present invention will be described hereinafter with reference to the drawings.

First Embodiment

Figure 6:
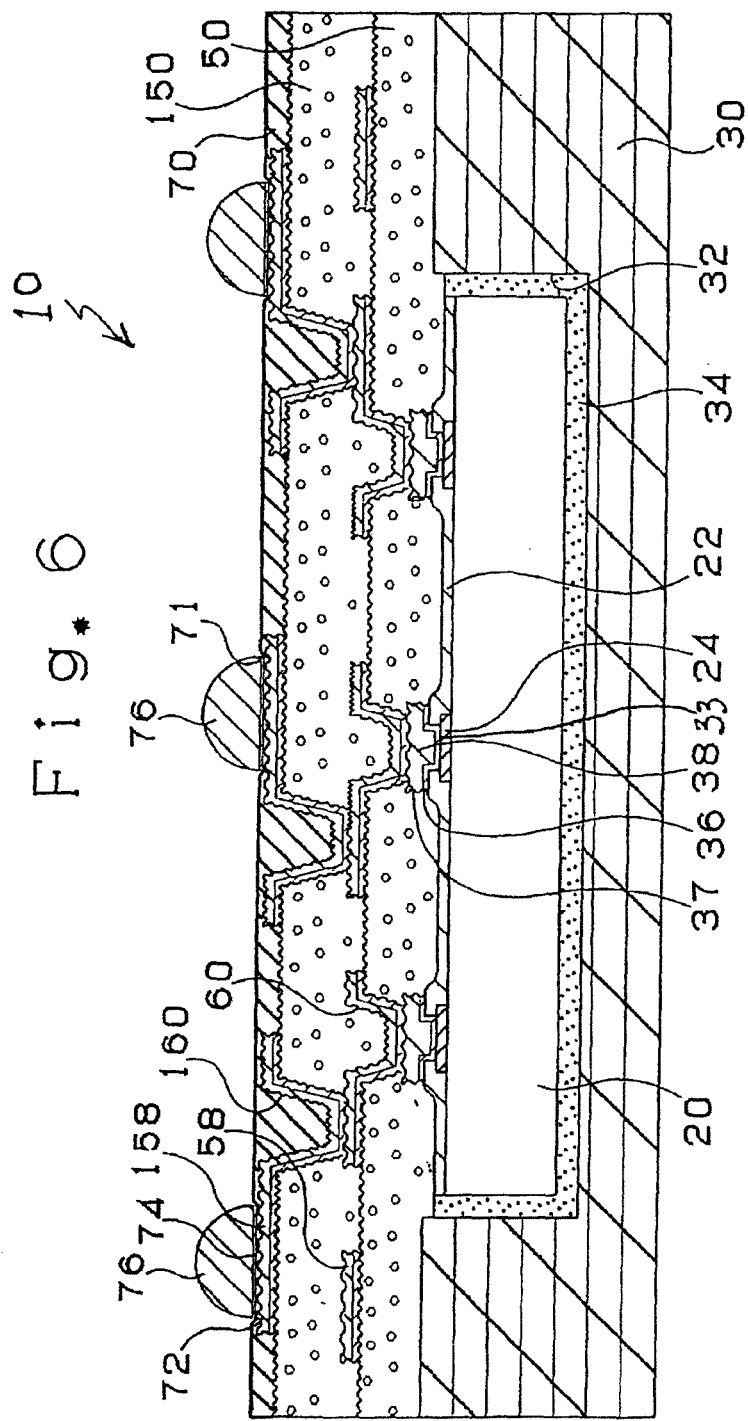
FIG. 6 is a cross-sectional view of the multilayer printed circuit board in the first embodiment.

First, the constitution of a multilayer printed circuit board according to the first embodiment of the present invention will be described with reference to FIG. 6 showing the cross-sectional view of a multilayer printed circuit board 10.

As shown in FIG. 6, the multilayer printed circuit board 10 consists of a core substrate 30 containing therein an IC chip 20, an interlayer resin insulating layer 50 and an interlayer resin insulating layer 150. Via holes 60 and conductor circuits 58 are formed on the interlayer resin insulating layer 50. Via holes 160 and conductor circuits 158 are formed on the interlayer resin insulating layer 150.

The IC chip 20 is covered with a passivation film 22 and die pads 24 each constituting an input/output terminal are provided in the openings of the passivation film 22. A transition layer 38 is formed on each die pad 24 made of aluminum. The transition layer 38 consists of three layers of the first thin film layer 33, the second thin film layer 36 and a thickening layer 37.

A solder resist layer 70 is provided on the interlayer resin insulating layer 150. BGA's 76 for connecting to an external substrate such as a daughter board or a mother board which is not shown in FIG. 6 are provided on the conductor circuits 158 under the openings 71 of the solder resist layer 70, respectively.

In the multilayer printed circuit board 10 in the first embodiment, the IC chip 20 is included in the core substrate 30 in advance and the transition layer 38 is provided on each die pad 24 of the IC chip 20. Due to this, it is possible to electrically connect the IC chip to the multilayer printed circuit board (or package substrate) without using lead members and a sealing resin. Further, since the transition layers 38 are formed on the IC chip portion, the IC chip portion is flattened and the upper interlayer insulating layer 50 is, therefore, flattened to thereby provide uniform film thickness. Further, because of the transition layers, it is possible to maintain the stability of shape even if the via holes 60 provided in the upper layer are formed.

Furthermore, by providing the transition layers 38 made of copper on the respective die pads 24, it is possible to prevent resin residues on the die pads 24 and to prevent the die pads 24 from being discolored or dissolved even after impregnating the multilayer printed circuit board in an acid, an oxidizer or an etching solution in a later step or conducting various annealing steps. Thus, connection characteristic between the die pads of the IC chip and the via holes and reliability can be improved. Furthermore, by interposing the transition layers 38 each having a diameter of 60 μm or more on the respective die pads 24 each having a diameter of about 40 μm, it is possible to ensure connecting the via holes each having a diameter of 60 μm or more.

Next, a method of manufacturing the multilayer printed circuit board described above with reference to FIG. 6 will be described with reference to FIGS. 1 to 5.

(1) First, an insulating resin substrate (or core substrate) 30 in which prepregs each having a core material made of glass cloths or the like and impregnated with a resin such as epoxy are built up, is used as a starting material (see FIG. 1(A)). Next, a recess 32 for containing an IC chip is formed on one side of the core substrate 30 by counter boring (see FIG. 1(B). While the recess is provided by counter boring herein, it is also possible to from a core substrate having a containing section by laminating an insulating resin substrate having an opening portion and an insulating resin substrate without an opening.

(2) Then, an adhesive material 34 is applied to the recess 32 using a printing machine. At this time, potting instead of application may be conducted. Next, an IC chip 20 is mounted on the adhesive material 34 (see FIG. 1(C)).

(3) Then, the upper surface of the IC chip 20 is depressed or struck to thereby completely contain the IC chip 20 in the recess 32 (see FIG. 1(D)). By doing so, the core substrate 30 can be smoothed.

(4) Thereafter, the entire surface of the core substrate 30 which contains the IC chip 20 therein is subjected to deposition or sputtering to form the conductive, first thin film layer 33 on the entire surface (FIG. 2(A)). A metal used may be tin, chromium, titanium, nickel, zinc, cobalt, gold or copper. Nickel, chromium or titanium is more preferable because it is capable of suppressing the entry of moisture into an interface, appropriate for film formation and in electrical characteristic. The thickness of the first thin film layer 33 is preferably 0.001 to 2.0 μm, more preferably, 0.01 to 1.0 μm. In case of chromium, the thickness is preferably 0.1 μm.

The die pad 24 is covered with the first thin film layer 33, thereby making it possible to improve the adhesiveness of the transition layer and the IC chip to the interface with the die pad 24. Also, by covering the die pad 24 with the metal, it is possible to prevent moisture from entering the interference, to prevent the dissolution and erosion of the die pad and to improve reliability. Further, the first thin film layer 33 allows the die pad to connect with the IC chip by a mounting method without using a lead. Here, if chromium, titanium or nickel is used, it is possible to prevent the entry of moisture into the interference and to ensure high metal adhesiveness.

(5) The second thin film layer 36 is formed on the first thin film layer 33 by sputtering, deposition or electroless plating (FIG. 2(B)). A metal used herein may be nickel, copper, gold or silver. Copper is preferable because the copper has good electrical characteristic and is economical and because a buildup conductor layer to be formed in a later step mainly consists of copper.

The reason for providing the second thin film layer is that an electroplating lead for forming a thickening layer to be described later cannot be provided only with the first thin film layer. The second thin film layer 36 is used as a lead for thickening and preferably 0.01 to 5 in thickness. The thickness is more preferably 0.1 to 3 μm. The second thin film layer having such a thickness is optimum to cover the first thin film and serve as a lead. If the thickness is less than 0.01 μm, the second thin film layer cannot function as a lead. If the thickness exceeds 5 μm, the first thin film layer under the second thin film layer is cut more than the second thin film layer and gaps are generated between the first and second thin film layers during etching. This makes the entry of moisture easier and deteriorates reliability.

A preferable combination of the first and second thin film layer is chromium-copper, chromium-nickel, titanium-copper, titanium-nickel or the like. These combinations are superior to the other combinations in view of junction with a metal and electrical conductivity.

(6) Thereafter, a resist is applied, exposure and development are conducted to provide a plated resist 35 while provide an opening on the upper portion of the die pad of the IC chip, and electroplating is conducted under the following conditions to thereby provide an electroplated film (or thickening film) 37 (FIG. 2(C)).

[Electroplating Solution]

| sulfuric acid | 2.24 mol/l |
| copper sulfate | 0.26 mol/l |
| additive | 19.5 ml/l |
| (Kapalacid HL manufactured by Atotech Japan) | |

[Electroplating Conditions]

| current density | 1 A/dm$^2$ |
| duration | 65 minutes |
| temperature | 22 ± 2° C. |

After removing the plating resist 35, the electroless-plated, second thin film layer 36 and first thin film layer 33 under the plating resist 35 are etched away, thereby forming a transition layer 38 on each of the die pads 24 of the IC chip (FIG. 2(D)). The transition layer is formed by the plating resist in this case. Alternatively, the transition layer may be formed on each die pad by after uniformly forming an electroless-plated film on the electroless-plated, second thin film layer 36, forming an etching resist, conducting exposure and development to expose the metal other than that of the transition layer, and conducting etching. The thickness of the electroplated film is preferably in the range of 1 to 20 μm. If the thickness exceeds the range, undercut may possibly occur during the etching to generate gaps in the interface between the transition layer to be formed and the via hole.

(7) Next, an etching solution is sprayed onto the substrate and the surface of the transition layer 38 is etched, thereby forming a rough surface 38α (see FIG. 3(A)). The rough surface can be also formed by electroless plating or an oxidization-reduction process. FIG. 7(A) is an enlarged view of the transition layer 38 shown in FIG. 3(A). FIG. 7(B) is a view seen from B of FIG. 7(A). The transition layer 38 is a three-layer structure consisting of the first thin film layer 33, the second thin film layer 36 and the thickening layer 37. As shown in FIG. 7(A), the transition is formed to be circular. It is also possible to form the transition layer to be not circular but ellipsoidal as shown in FIG. 7(C), rectangular as shown in FIG. 7(D) or oval as shown in FIG. 7(E).

(8) A thermosetting resin sheet having a thickness of 50 μm is vacuum-compression laminated onto the substrate which has gone through the above-stated steps at a pressure of 5 kg/cm$^2$ while raising temperature to 50 to 150° C., thereby providing an interlayer resin insulating layer 50 (see FIG. 3(B)). The degree of vacuum at the time of vacuum compression is 10 mmHg.

(9) Next, using $CO_2$ gas laser having a wavelength of 10.4 μm, via hole openings 48 each having a diameter of 80 μm are provided in the interlayer resin insulating layer 50 under the conditions of a beam diameter of 5 mm, a top hat mode, a pulse width of 5.0 μm, a mask hole diameter of 0.5 mm and one shot (see FIG. 3(C)). Using a chromium acid, resin residues in the openings 48 are removed. By providing the transition layer 38 made of copper on each die pad 24, it is possible to prevent resin residues on the die pad 24, thereby improving connection characteristic between the die pad 24 and a via hole 60 to be described later and improving reliability. Furthermore, by interposing the transition layer 38 having a diameter of 60 μm or more on the die pad 24 having a diameter of about 40 μm, it is possible to ensure connecting the via hole opening 48 having a diameter of 60 μm. While the resin residues are removed by using a permanganic acid, a de-smear process can be also conducted using oxygen plasma.

(10) Next, the resultant substrate is immersed in an oxidizer such as a chromic acid or a permanganic acid or the like, thereby providing a rough surface 50α on the interlayer resin insulating layer 50 (see FIG. 3(D)). The rough surface 50α is preferably formed in the range of 0.05 to 5 μm. For example, the substrate is immersed in 50 g/l of a sodium permanganate solution at a temperature of 60° C. for 5 to 25 minutes, thereby providing a rough surface 50α of 1 to 5 μm. Alternatively, by performing a plasma process using SV-4540 manufactured by ULVAC JAPAN Ltd., the rough surface 50α can be formed on the interlayer resin insulating layer 50. In that case, argon gas is used as inactive gas to perform a plasma process for two minutes under conditions of electric power of 200 W, a gas pressure of 0.6 Pa and a temperature of 70° C.

(11) A metallic layer 52 is provided on the interlayer resin insulating layer 50 on which the rough surface 50α is formed (see FIG. 4(A)). The metallic layer 52 is formed by electroless plating. By supplying a catalyst such as a palladium catalyst to the surface layer of the interlayer resin insulating layer 50 in advance and immersing the substrate into an electroless plating solution for 5 to 60 minutes, the metallic layer 52 which is a plated film in the range of 0.1 to 5 μm is provided. For example, the substrate was immersed in the following solution at a solution temperature of 34° C. for 40 minutes:

[Electroless Plating Solution]

| | |
|---|---|
| $NiSO_4$ | 0.003 mol/l |
| tartaric acid | 0.200 mol/l |
| copper sulfate | 0.030 mol/l |
| HCHO | 0.050 mol/l |
| NaOH | 0.100 mol/l |
| α,α'-bipyridyl | 100 mg/l |
| polyethylene glycol (PEG) | 0.10 g/l |

Alternatively, an Ni/Cu metallic layer 52 can be formed on the surface of the interlayer resin insulating layer 50 by exchanging internal argon gas and then conducting sputtering with and Cu as targets under conditions of an air pressure of 0.6 Pa, a temperature of 80° C., power of 200 W and a duration of five minutes with the same device as that used for the above-stated plasma process. At this time, the thickness of an Ni/Cu metallic layer 52 formed is 0.2 μm. Alternatively, the metallic film can be formed by deposition, electrodeposition or the like instead of sputtering. It is also possible to form a thin layer by a physical method such as sputtering, deposition or electrodeposition and then to conduct electroless plating.

(12) A commercially available photosensitive dry film is bonded to the substrate 30 which has been subjected to the above process, a chromium glass mask is mounted, exposure is performed at 40 mj/cm$^2$ and then a development process is conducted with 0.8% sodium carbonate, thereby providing plating resists 54 each having a thickness of 25 μm (see FIG. 4(B)). Next, electroplating is conducted under the following conditions to form an electroplated film 56 having a thickness of 18 μm. An additive in the electroplating solution is Kapalacid HL manufactured by Atotech Japan.

[Electroplating Solution]

| | |
|---|---|
| sulfuric acid | 2.24 mol/l |
| copper sulfate | 0.26 mol/l |
| additive | 19.5 ml/l |
| (Kapalacid HL manufactered by Atotech Japan) | |

[Electro Plating Conditions]

| | |
|---|---|
| current density | 1 A/dm$^2$ |
| duration | 65 minutes |
| temperature | 22 ± 2° C. |

(13) After separating and removing the plating resist 54 with 5% NaOH, the metallic layer 52 under the plating resist is dissolved and removed by etching using a mixture solution of an nitric acid and oxygenated water, conductor circuits 58 each consisting of the metallic layer 52 and the electroplated film 56 and having a thickness of 16 μm and via holes 60 are formed and etched by an etching solution containing a cupric salt complex and an organic acid, thereby forming rough surfaces 58α and 60α (see FIG. 4(C)). Alternatively, the rough surfaces can be formed by electroless plating or an oxidization-reduction process.

(14) Next, the steps of (9) to (13) stated above are repeated, thereby forming an upper interlayer resin insulating layer 150 and conductor circuits 158 (include via holes 160) (see FIG. 5(A)).

(15) Then, 46.67 parts by weight of oligomer (having a molecular weight of 4000) which is obtained by forming 50% of epoxy groups of 60 parts by weight of a cresol novolac epoxy resin (manufactured by Nippon Kayaku) dissolved in diethylene glycol dimethyl ether (DMDG) into an acrylic structure and which imparts photosensitive characteristic, 15 parts by weight of 80 wt % of a bisphenol A epoxy resin (product name: Epicoat 1001 manufactured by Yuka Shell) dissolved in methylethyl keton, 1.6 parts by weight of an imidazole hardening agent (product name: 2E4MZ-CN manufactured by Shikoku Chemicals), 3 parts by weight of polyhydric acryl monomer which is a photosensitive monomer (product name: R604 manufactured by Kyoei Chemical), 1.5 parts by weight of polyhydric acryl monomer (product name: DPE6A manufactured by Kyoei Chemical), and 0.71 parts by weight of a dispersing defoaming agent (product name: S-65 manufactured by Sannopuko) are contained in a container, agitated and mixed to adjust mixture compositions. Then, 2.0 parts by weight of benzophenone (manufactured by Kanto Chemical) serving as a photoinitiator and 0.2 parts by weight of Michler's ketone (manufactured by Kanto Chemical) serving as a photosensitizer are added to the mixture compositions, thereby obtaining a solder resist composition (or organic resin insulating material) adjusted to have a viscosity of 2.0 Pa·s.

Note that the viscosity is measured by using No. 4 rotor of a B-type viscometer (DVL-B manufactured by Tokyo Keiki) when the velocity is 60 rpm and using No. 3 rotor of the same when the velocity is 6 rpm.

(16) Next, the solder resist composition is applied to the substrate 30 to have a thickness of 20 μm and a drying process is conducted at 70° C. for 20 minutes and 70° C. for 30 minutes. Then, a photomask film having a pattern of the solder resist opening portions drawn thereon and a thickness of 5 mm is made hermetic contact with the solder resist layer 70, exposure is performed with ultraviolet rays with 1000 mj/cm$^2$ and then a development process is performed with a DMTG solution, thereby forming openings 71 each having a land diameter of 620 μm and an opening diameter of 460 μm (see FIG. 5(B)).

(17) Next, the substrate on which the solder resist layer (or organic resin insulating layer) 70 is formed, is immersed in an electroless nickel plating solution containing nickel chloride ($2.3 \times 10^{-1}$ mol/l), sodium hypophosphite ($2.8 \times 10^{-1}$ mol/l), sodium citrate ($1.6 \times 10^{-1}$ mol/l) and having pH=4.5 for 20 minutes, and a nickel plate layer 72 having a thickness of 5 μm is formed on each opening portion 71. Then, the substrate is further immersed in an electroless plating solution containing gold potassium cyanide ($7.6 \times 10^{-3}$ mol/l), ammonia chloride ($1.9 \times 10^{-1}$ mol/l), sodium citrate ($1.2 \times 10^{-1}$ mol/l) and sodium hypophosphite ($1.7 \times 10^{-1}$ mol/l) under the condition of 80° C. for 7.5 minutes and a gold plated layer 74 having a thickness of 0.03 μm is formed on the nickel plated layer 72, thereby forming a solder pad 75 on each conductor layer 158 (see FIG. 5(C)).

(18) Thereafter, a solder paste is printed on the opening portion 71 of the solder resist layer 71 and reflowed at 200'C, thereby forming a BGA's 76. As a result, it is possible to obtain a multilayer printed circuit board 10 including the IC chip 20 and having the BGA's 76 (see FIG. 6). Instead of the BGA's, PGA (conductive contact pins) may be arranged.

In the above-stated embodiment, the thermosetting resin sheet is used for the interlayer resin insulating layers 50 and 150. The thermosetting resin insulating sheet contains a refractory resin, soluble particles, a hardening agent and other components. The materials will now be described one by one.

The epoxy resin which can be used in the thermosetting resin sheet in the first embodiment has a structure that particles soluble in an acid or an oxidizer (to be referred to as "soluble particles" hereinafter) are dispersed in a resin which is refractory with respect to an acid or an oxidizer (to be referred to as "refractory resin" hereinafter). The expressions "refractory" and "soluble" are used as follows. When materials are immersed in a solution composed of the same acid or the same oxidizer for the same time, a material of a type which is dissolved at a relatively high dissolving rate is called a "soluble" material and a material of a type which is dissolved at a relatively slow dissolving rate is called "refractory material" for convenience.

The soluble particles are exemplified by resin particles which are soluble in an acid or an oxidizer (to be referred to as "soluble resin particles" hereinafter), inorganic particles which are soluble in an acid or an oxidizer (to be referred to as "inorganic soluble particles" hereinafter), metal particles which are soluble in an acid or an oxidizer (to be referred to as "soluble metal particles" hereinafter) and the like. The foregoing soluble particles may be employed solely or two or more particles may be mixed.

The shape of each of the soluble particles is not limited. The shape may be a spherical shape or a pulverized shape. It is preferable that the soluble particles have a uniform shape. The reason for this lies in that a rough surface having uniformly rough pits and projections can be formed.

It is preferable that the mean particle size of the soluble particles is 0.1 μm to 10 μm. When the particles have the diameters satisfying the foregoing range, two or more particles having different particle sizes may be employed. That is, soluble particles having a mean particle size of 0.1 μm to 0.5 μm and soluble particles having a mean particle size of 1 μm to 3 μm may be mixed. Thus, a more complicated rough surface can be formed. Moreover, the adhesiveness with the conductor circuit can be improved. In the first embodiment, the particle size of the soluble particles is the length of a longest portion of each of the soluble particles.

The soluble resin particles are exemplified by particles constituted by a thermosetting resin or a thermoplastic resin. When the particles are immersed in solution composed of an acid or an oxidizer, the particles must exhibit dissolving rate higher than that of the foregoing refractory resin.

Specifically, the soluble resin particles are exemplified by particles constituted by an epoxy resin, a phenol resin, a polyimide resin, a polyphenylene resin, a polyolefin resin or a fluorine resin. The foregoing material may be employed solely or two or more materials may be mixed.

The soluble resin particles may exemplified by resin particles constituted by rubber. The rubber above is exemplified by polybutadiene rubber, a variety of denatured polybutadiene rubber, such as denatured epoxy rubber, denatured urethane rubber or denatured (meta) acrylonitrile rubber, and (meta) acrylonitrile butadiene rubber containing a carboxylic group. When the foregoing rubber material is employed, the soluble resin particles can easily be dissolved in an acid or an oxidizer. That is, when the soluble resin particles are dissolved with an acid, dissolution is permitted with an acid other than a strong acid, and when dissolved with an oxidizer, dissolution is permitted with permanganate which has a relatively weak oxidizing power. When chromic acid is employed, dissolution is permitted even at a low concentration. Therefore, the retention of the acid or the oxidizer on the surface of the resin can be prevented. When a catalyst, such as palladium chloride, is supplied after the rough surface has been formed as described later, the inhibition of supply of the catalyst and the oxidation of the catalyst can be prevented.

The inorganic soluble particles are exemplified by particles made of at least a material selected from a group consisting of an aluminum compound, a calcium compound, a potassium compound, a magnesium compound and a silicon compound.

The aluminum compound is exemplified by alumina, aluminum hydroxide and the like. The calcium compound is exemplified by calcium carbonate, calcium hydroxide and the like. The potassium compound is exemplified by potassium carbonate and the like. The magnesium compound is exemplified by magnesia, dolomite, basic magnesium carbonate and the like. The silicon compound is exemplified by silica, zeolite and the like. The foregoing material may be employed solely or two or more materials may be mixed.

The soluble metal particles are exemplified by particles constituted by at least one material selected from a group consisting of copper, nickel, iron, zinc, lead, gold, silver, aluminum, magnesium, potassium and silicon. The soluble metal particles may have surfaces coated with a resin or the like in order to maintain insulating characteristic.

When two or more types of the soluble particles are mixed, it is preferable that the combination of the two types of soluble particles is a combination of resin particles and inorganic particles. Since each of the particles has low electric conductivity, insulating characteristic with the resin film can be maintained. Moreover, the thermal expansion can easily be adjusted with the refractory resin. Thus, the occurrence of a crack on the interlayer resin insulating layer constituted by the resin film can be prevented. The separation between the interlayer resin insulating layer and the conductor circuit can be prevented.

The refractory resin is not limited when the resin is able to maintain the shape of the rough surface when the rough surface is formed on the interlayer resin insulating layer by using an acid or an oxidizer. For example, the refractory resin is exemplified by a thermosetting resin, a thermoplastic resin and their composite material. As an alternative to this, the foregoing photosensitive resin of a type having photosensitive characteristics imparted thereto may be employed. When the photosensitive resin is employed, exposure and development processes can be performed to of the interlayer rein insulating layers to thereby form openings for the via holes.

In particular, it is preferable that the resin containing a thermosetting resin is employed. In the foregoing case, the shape of the rough surface can be maintained against a plating solution and when a variety of heating processes are performed.

The refractory resin is exemplified by an epoxy resin, a phenol resin, a phenoxy resin, a polyimide resin, a polyphenylene resin, a polyolefin resin, a fluorine resin and the like. The foregoing material may be employed solely or two or more types of the materials may be mixed. A thermosetting resin, a thermoplastic resin or a complex thereof may be employed.

It is preferable that an epoxy resin having two or more epoxy groups in one molecule thereof is employed. The reason for this lies in that the foregoing rough surface can be formed. Moreover, excellent heat resistance and the like can be obtained. Thus, the concentration of a stress onto the metallic layer can be prevented even under a heat cycle condition. Thus, the occurrence of separation of the metallic layer can be prevented.

The epoxy resin is exemplified by a cresol novolac epoxy resin, a bisphenol-A epoxy resin, a bisphenol-F epoxy resin, a phenol novolac epoxy resin, an alkylphenol novolac epoxy resin, a biphenol-F epoxy resin, a naphthalene epoxy resin, a dicyclopentadiene epoxy resin, an epoxy material constituted by a condensation material of phenol and an aromatic aldehyde having a phenol hydroxyl group, triglycidyl isocyanurate and alicyclic epoxy resin. The foregoing material may be employed solely or two or more material may be mixed. Thus, excellent heat resistance can be obtained.

It is preferable that the soluble particles in the resin film used in the first embodiment are substantially uniformly dispersed in the refractory resin. The reason for this lies in that a rough surface having uniform pits and projections can be formed. When via holes and through holes are formed in the resin film, adhesiveness with the metallic layer of the conductor circuit can be maintained. As an alternative to this, a resin film containing soluble particles in only the surface layer on which the rough surface is formed may be employed. Thus, the portions of the resin film except for the surface layer is not exposed to an acid or an oxidizer. Therefore, the insulating characteristic between conductor circuits through the interlayer resin insulating layers can reliably be maintained.

It is preferable that the amount of the soluble particles which are dispersed in the refractory resin is 3 wt % to 40 wt % with respect to the resin film. When the amount of mixture of the soluble particles is lower than 3 wt %, the rough surface having required pits and projections cannot be formed. When the amount is higher than 40 wt %, the deep portions of the resin film are undesirably dissolved when the soluble particles are dissolved by using an acid or an oxidizer. Thus, the insulating layer constituted by the resin film cannot be maintained. This sometimes causes short circuit.

It is preferable that the resin film contains a hardening agent and other components as well as the refractory resin.

The hardening agent is exemplified by an imidazole hardening agent, an amino hardening agent, a guanidine hardening agent, an epoxy adduct of each of the foregoing hardening agents, a microcapsule of each of the foregoing hardening agents and an organic phosphine compound such as triphenylphosphine or tetraphenyl phosphonium tetraphenyl borate.

It is preferable that the content of the hardening agent is 0.05 wt % to 10 wt % in the resin film. If the content is lower than 0.05 wt %, the resin film cannot sufficiently be hardened. Thus, the introduction of the acid and the oxidizer into the resin film occurs more frequently and the insulating characteristic of the resin film sometimes deteriorates. When the content is higher than 10 wt %, an excessively large quantity of the hardening agent component sometimes denatures the composition of the resin and the reliability sometimes deteriorates.

The other components are exemplified by an inorganic compound which does not exert an influence on the formation of the rough surface and a filler such as a resin. The inorganic compound is exemplified by silica, alumina, dolomite and the like. The resin is exemplified by a polyimide resin, a polyacrylic resin, a polyamideimide resin, a polyphenylene resin, a melanine resin, an olefin resin and the like. If any one of the foregoing fillers is contained, then the conformity of thermal expansion coefficients can be established and heat resistance, chemical resistance can be improved and the performance of the multilayer printed circuit board can be thereby improved.

The resin film may contain a solvent. The solvent is exemplified by ketone such as acetone, methyl ethyl ketone or cyclohexane, aromatic hydrocarbon such as ethyl acetate, butyl acetate, cellosolve acetate, toluene or xylene. The foregoing material may be employed solely or two or more materials may be mixed. However, the interlayer resin insulating layers made from the foregoing materials are dissolved and carbonated at a temperature of 350° C. or higher.

After bonding the resin film, the film is opened by laser and via holes are formed in the interlayer resin insulating layers. Thereafter, the substrate is immersed in an acid or an oxidizer to thereby form rough surfaces on the interlayer resin insulating layers. The acid is exemplified by an strong acid such as a sulfuric acid, a phosphoric acid, a hydrochloric acid or a formic acid. The oxidizer is exemplified by a chromic acid, a mixture of chromium and a sulfuric acid, permanganate and the like. Soluble particles are dissolved or separated using the acid or oxidizer, thereby forming rough surfaces on the interlayer resin insulating layers. A catalyst such as Pb is supplied to the interlayer resin insulating layers on which the rough layers are formed, and then electroless plating is performed. Plating resist unformed regions are formed by providing a resist on the electroless plated film and conducting exposure and development. The regions are electroplated, the resist is separated, and the electroplated films on the interlayer resin insulating layers are removed by etching, thereby forming via holes and conductor circuits.

FIG. 8(A) is a perspective view of the multilayer printed circuit board 10 according to the first embodiment. FIG. 8(B) is an explanatory view showing the multilayer printed circuit board 10 which is partly enlarged. Semiconductor bumps (ball-grid arrays) 76 are provided in a hound's tooth manner on the entire surface of the multilayer printed circuit board 10. In the first embodiment, by forming the BGA's 76 on the IC chip 20, it is possible to shorten the lengths of wirings from the IC chip 20.

First Modification of First Embodiment

FIG. 9(A) is a perspective view of a multilayer printed circuit board 10 according to the first modification of the first embodiment. FIG. 9(B) is an explanatory view showing the multilayer printed circuit board 10 which is partly enlarged in the modification. Semiconductor bumps (ball-grid arrays) 76 are provided in a hound's tooth manner on the surface of the multilayer printed circuit board 10 in all corners except for the portion on the IC chip 20. In this modification, by avoiding forming the bumps 76 on the IC chip 20, it is made advantageously difficult for the BGA's 76 to be thermally and electromagnetically influenced by the IC chip.

Second Modification of First Embodiment

Figure 10:
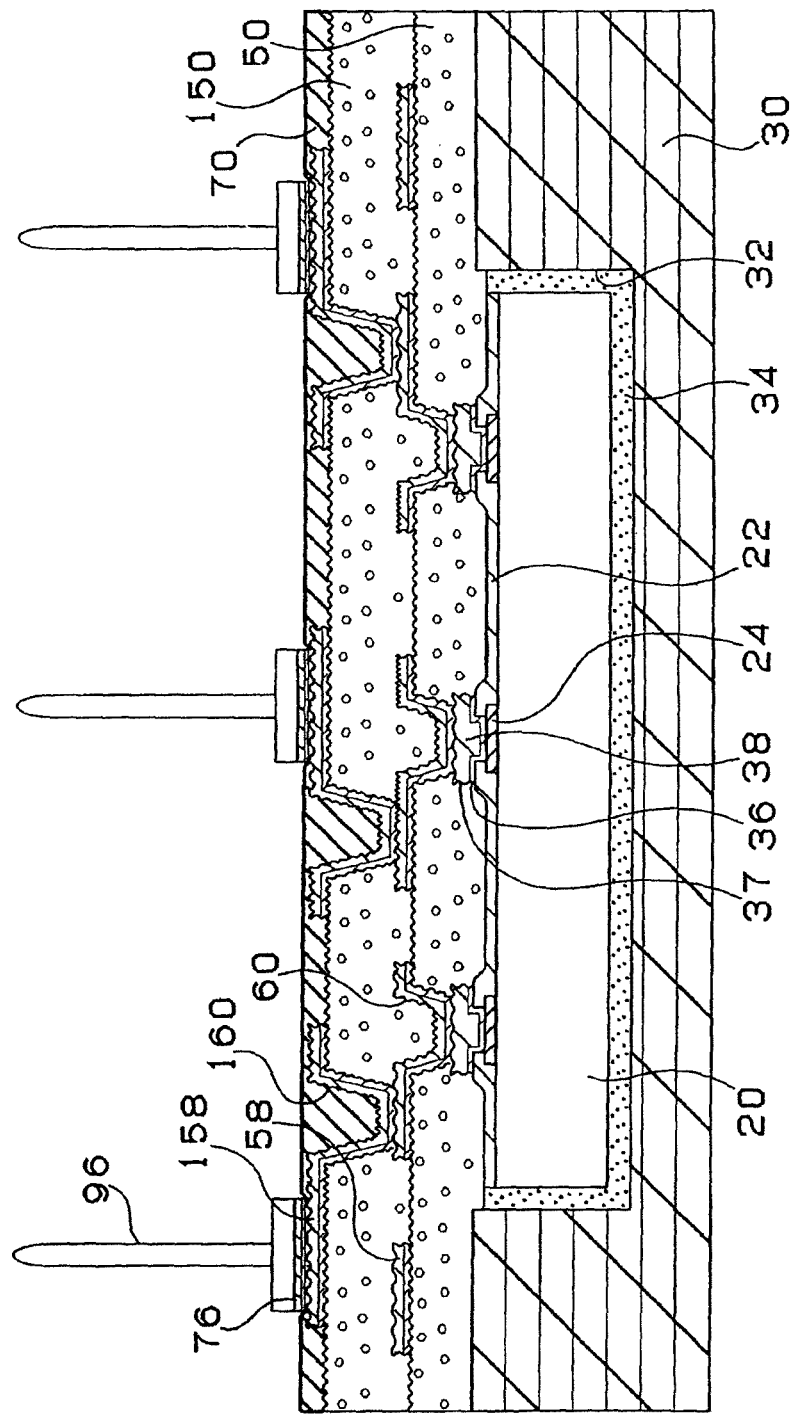
FIG. 10 is a cross-sectional view of a printed circuit board in the second modification of the first embodiment.

Next, description will be given to a multilayer printed circuit board according to the second modification of the first embodiment with reference to FIG. 10. In the first embodiment stated above, description has been given to a case where the BGA's are arranged. In the second modification, which is almost the same as the first embodiment, the multilayer printed circuit board is constituted in a PGA mode for establishing connection through conductive connection pins 96 as shown in FIG. 10.

Third Modification of First Embodiment

Figure 11:
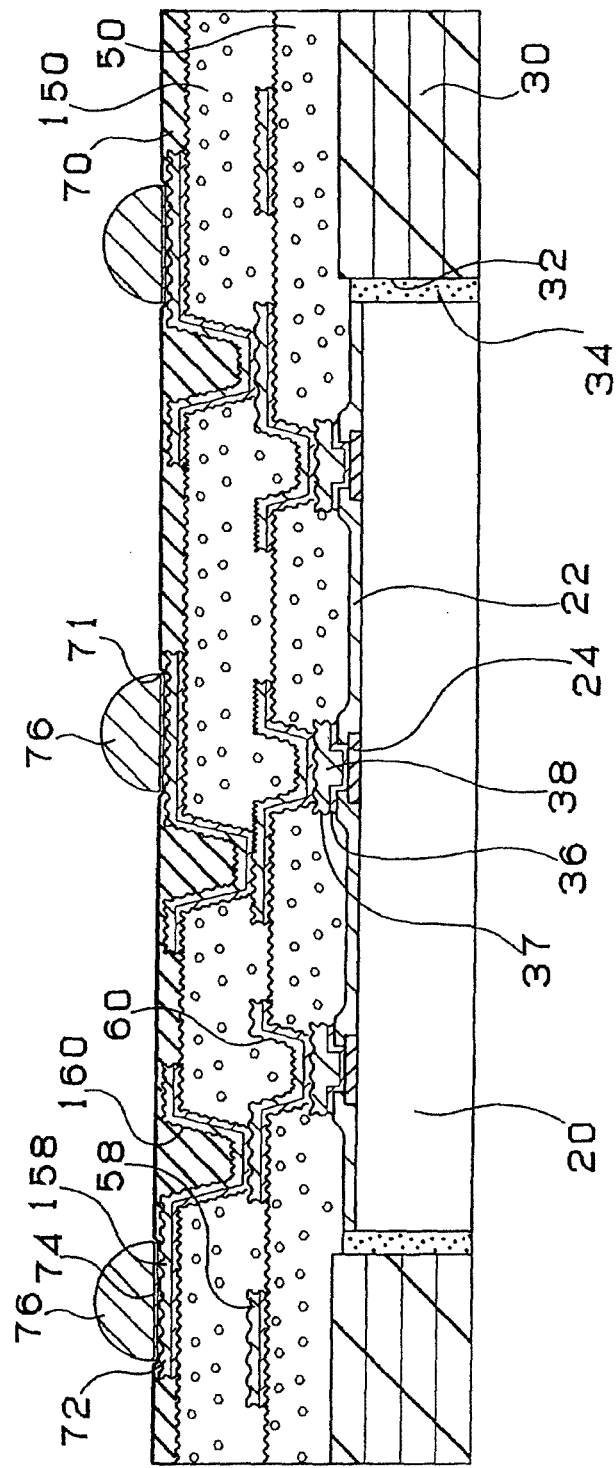
FIG. 11 is a cross-sectional view of a printed circuit board in the third modification of the first embodiment.

Next, description will be given to a multilayer printed circuit board according to the third modification of the first embodiment with reference to FIG. 11.

In the first embodiment stated above, the IC chip is contained in the recess 32 provided in the core substrate 30 by counter boring. In the third modification, by contrast, an IC chip 20 is contained in a through hole 32 formed in the core substrate 30. In this third modification, a heat sink can be directly attached to the rear surface side of the IC chip 20, so that it is advantageous that the IC chip 20 can be cooled efficiently.

Fourth Modification of First Embodiment

Figure 12:
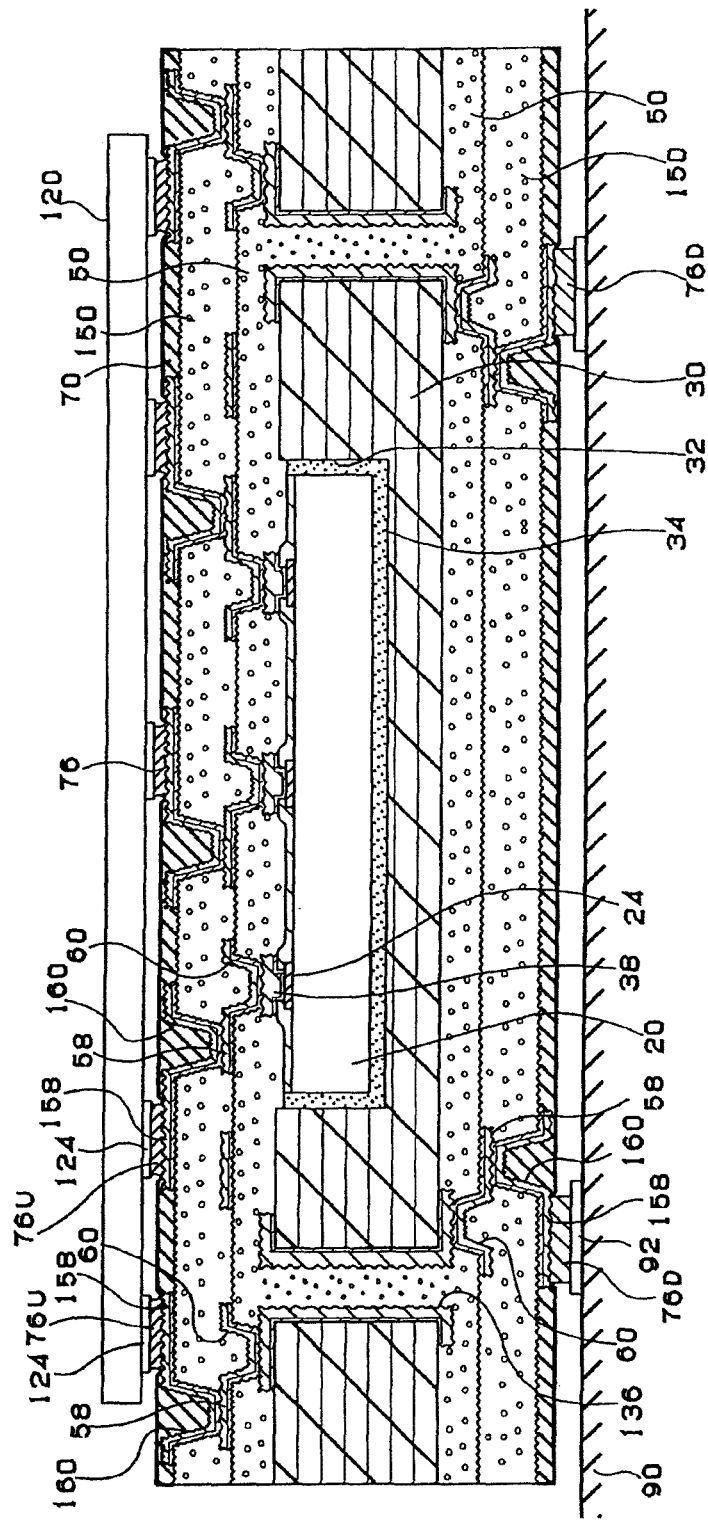
FIG. 12 is a cross-sectional view of a multilayer printed circuit board in the fourth modification of the first embodiment.
Figure 13:
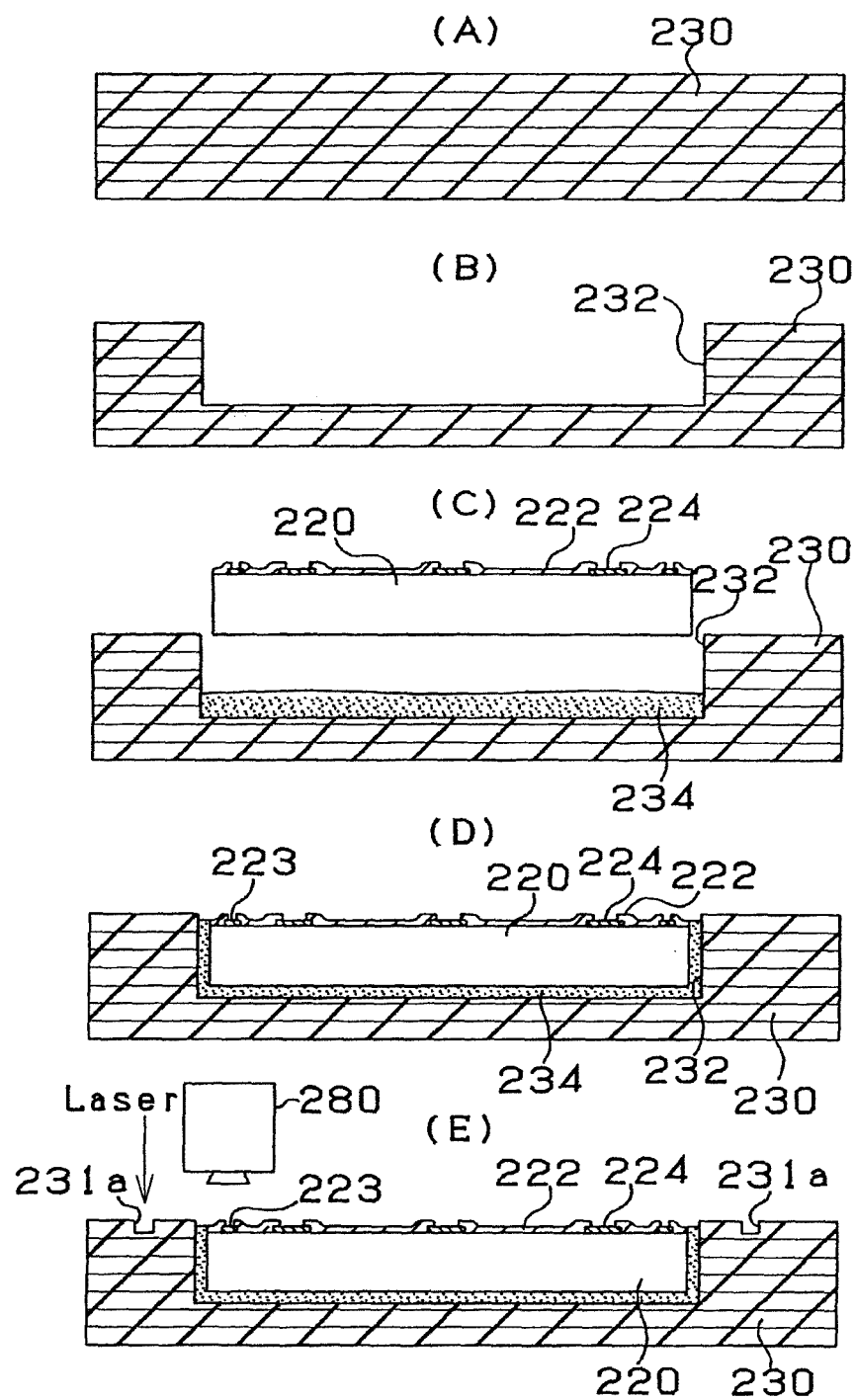
FIG. 13 is a diagram showing a process for manufacturing a multilayer printed circuit board in the second embodiment.
Figure 15:
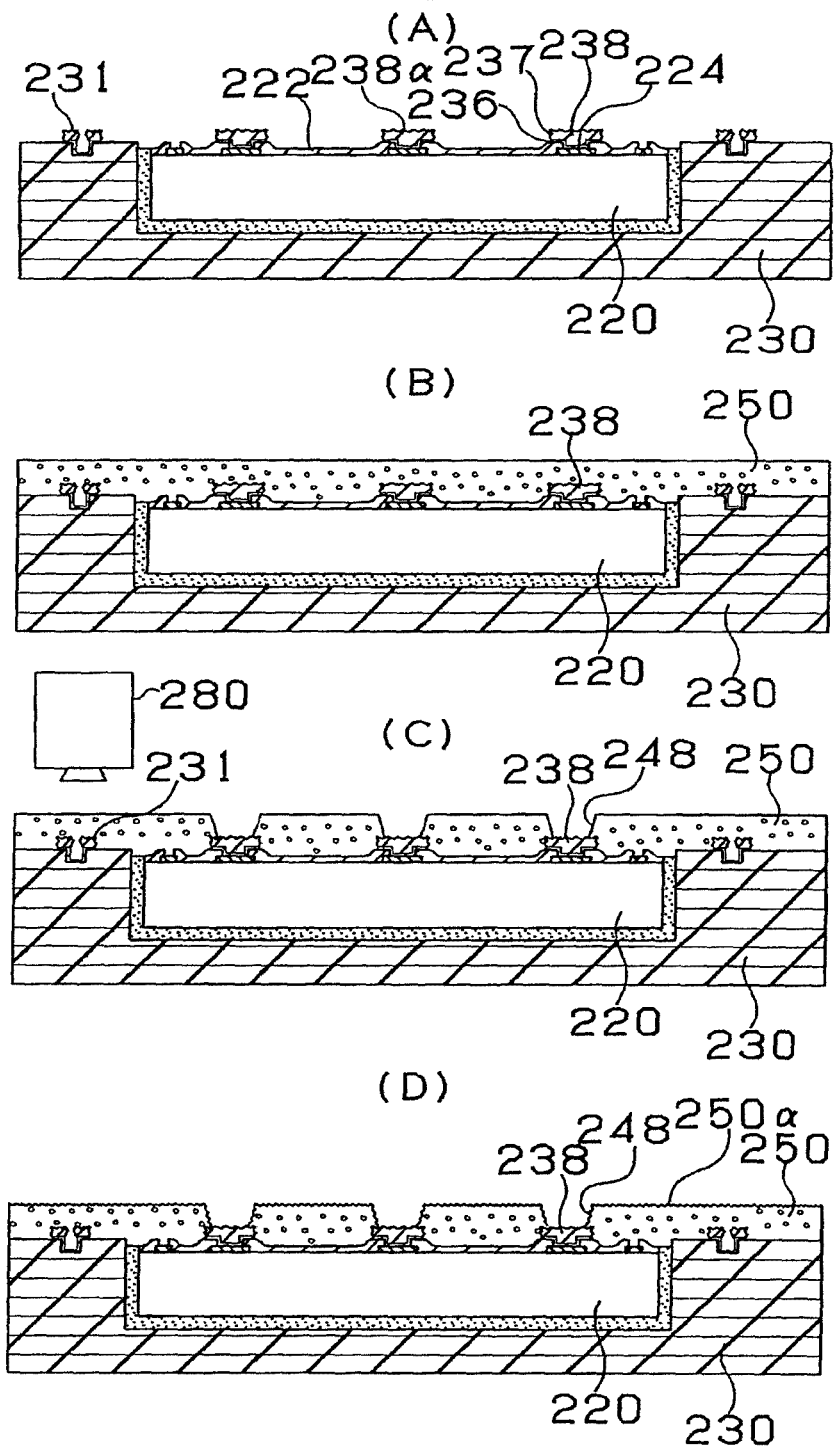
FIG. 15 is a diagram showing a process for manufacturing a multilayer printed circuit board in the second embodiment.
Figure 16:
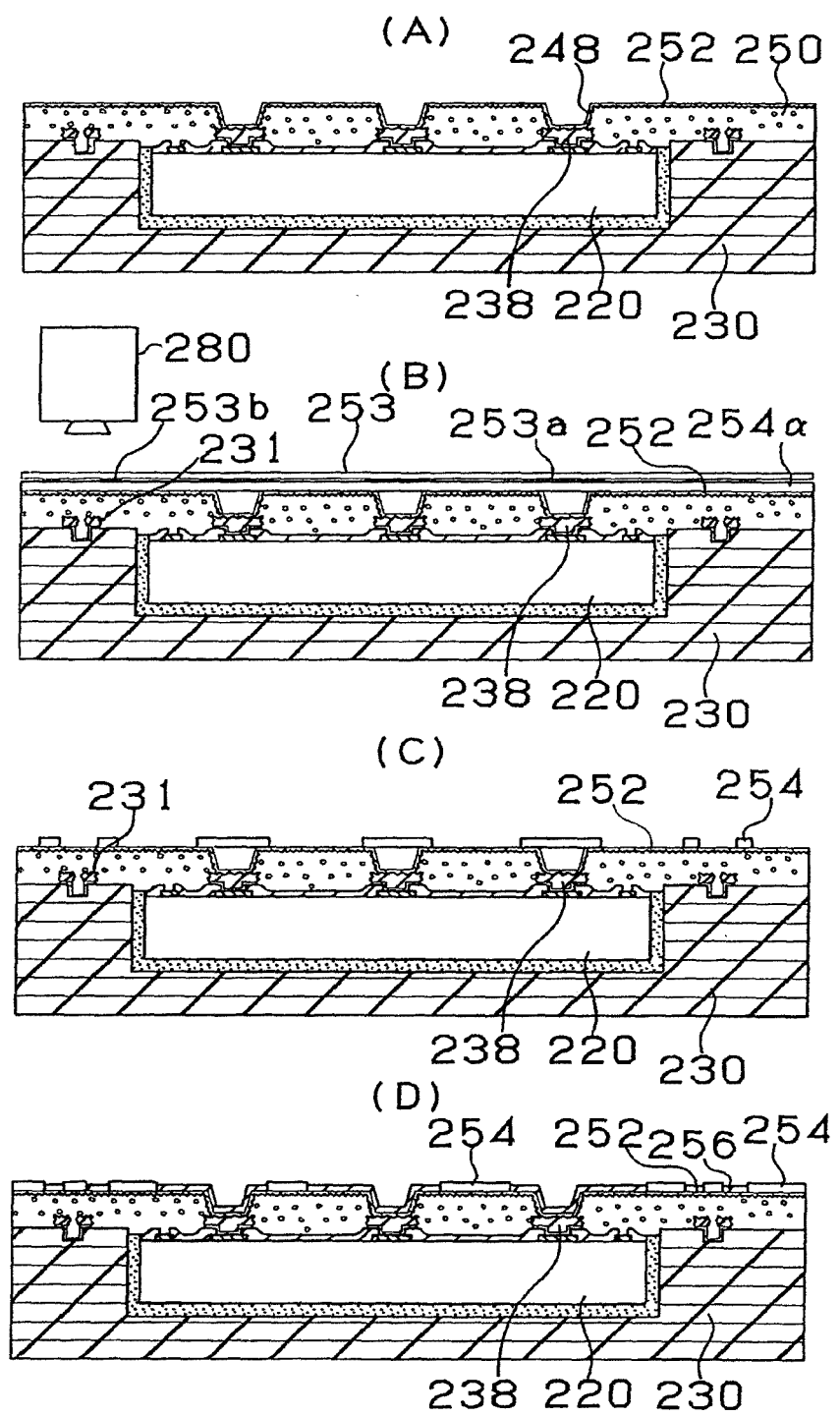
FIG. 16 is a diagram showing a process for manufacturing a multilayer printed circuit board in the second embodiment.
Figure 17:
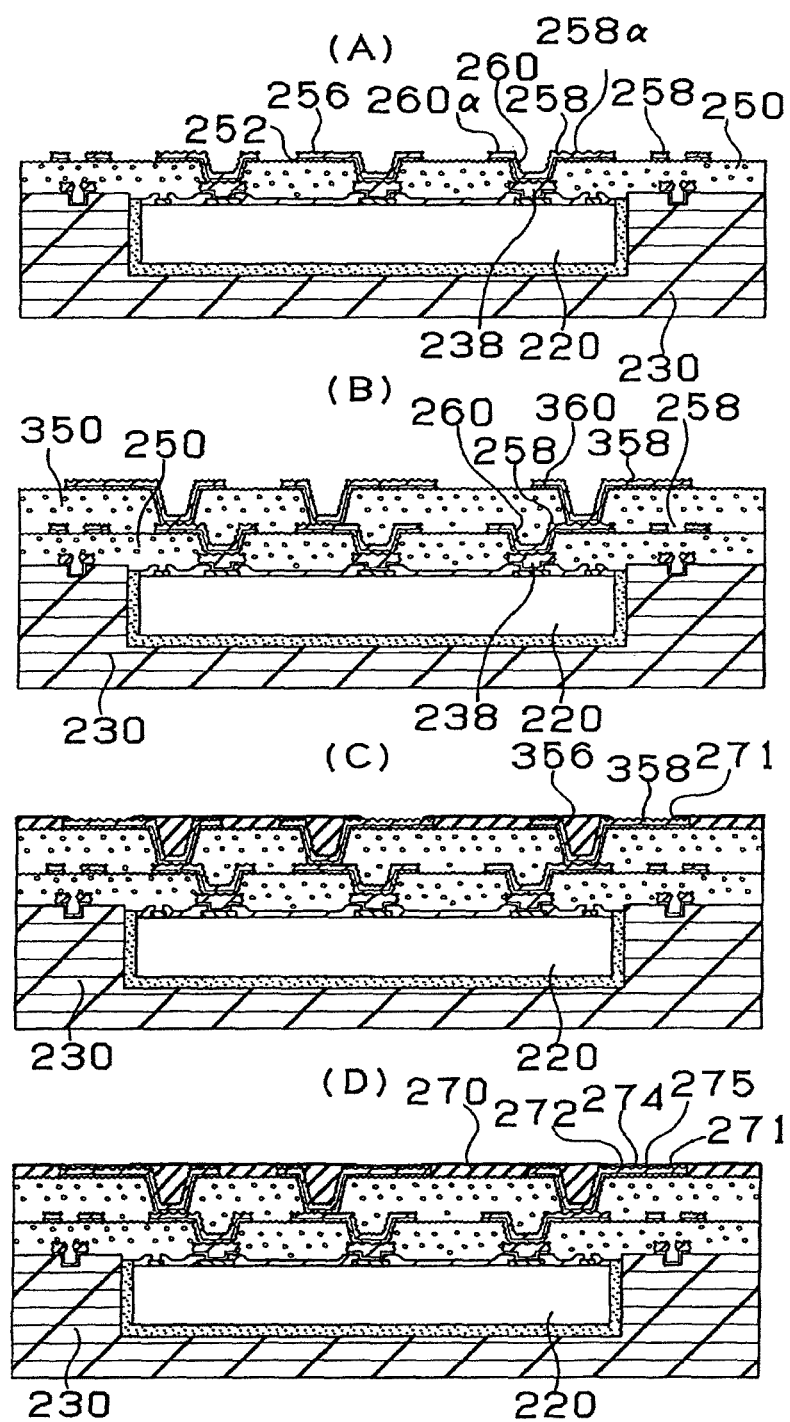
FIG. 17 is a diagram showing a process for manufacturing a multilayer printed circuit board in the second embodiment.

Next, a multilayer printed circuit board in the fourth modification of the first embodiment will be described with reference to FIG. 12.

In the first embodiment stated above, the IC chip is contained in the multilayer printed circuit board. In the fourth modification as shown at FIG. 12, by contrast, an IC chip 20, as the first electronic component, is contained in the multilayer printed circuit board and a second electronic component as IC chip 120 is mounted on the surface of the multilayer printed circuit board. As the IC chip 20 included in the layer, a cache memory having a relatively low calorific value is employed. As the IC chip 120 mounted on the surface, a CPU for arithmetic operation is employed.

The die pads 24 of the IC chip 20 and the die pads 124 of the IC chip 120 are mutually connected through transition layers 38—via holes 60—conductor circuits 58
—via holes 160—conductor circuit 158—BGA's 76U, respectively. On the other hand, the die pads 124 of the IC chip 120 and the pads 92 of a daughter board 90 are mutually connected through BGA's 76U—conductor circuits 158—via holes 160—conductor circuits 58—via holes 60—through holes 136—via holes 60—conductor circuits 58—via holes 60—conductor circuits 158—BGA's 76U, respectively.

In the fourth modification, it is possible to arrange the IC chip 120 and the cache memory 20 in proximity while separately manufacturing the cache memory 20 having low yield and the IC chip 120 for the CPU, and to operate the IC chips at high speed. In this fourth modification, by including an IC chip in the multilayer printed circuit board and, at the same time, mounting an IC chip on the surface thereof, it is possible to package electronic components such as IC chips having different functions and to thereby obtain a multilayer printed circuit board having greater functions.

With the structure of the first embodiment, the IC chip and the printed circuit board can be connected to each other without using lead members. Due to this, resin sealing becomes unnecessary. Furthermore, since no defects resulting from the lead members and sealing resin occur, connection characteristic and reliability are improved. Besides, since the die pads of the IC chip are directly connected to the conductive layers of the printed circuit board, it is possible to improve electrical characteristic.

Moreover, compared with the conventional IC chip mounting method, the wiring length from the IC chip to the substrate to the external substrate can be advantageously shortened and loop inductance can be advantageously reduced.

Second Embodiment

Figure 18:
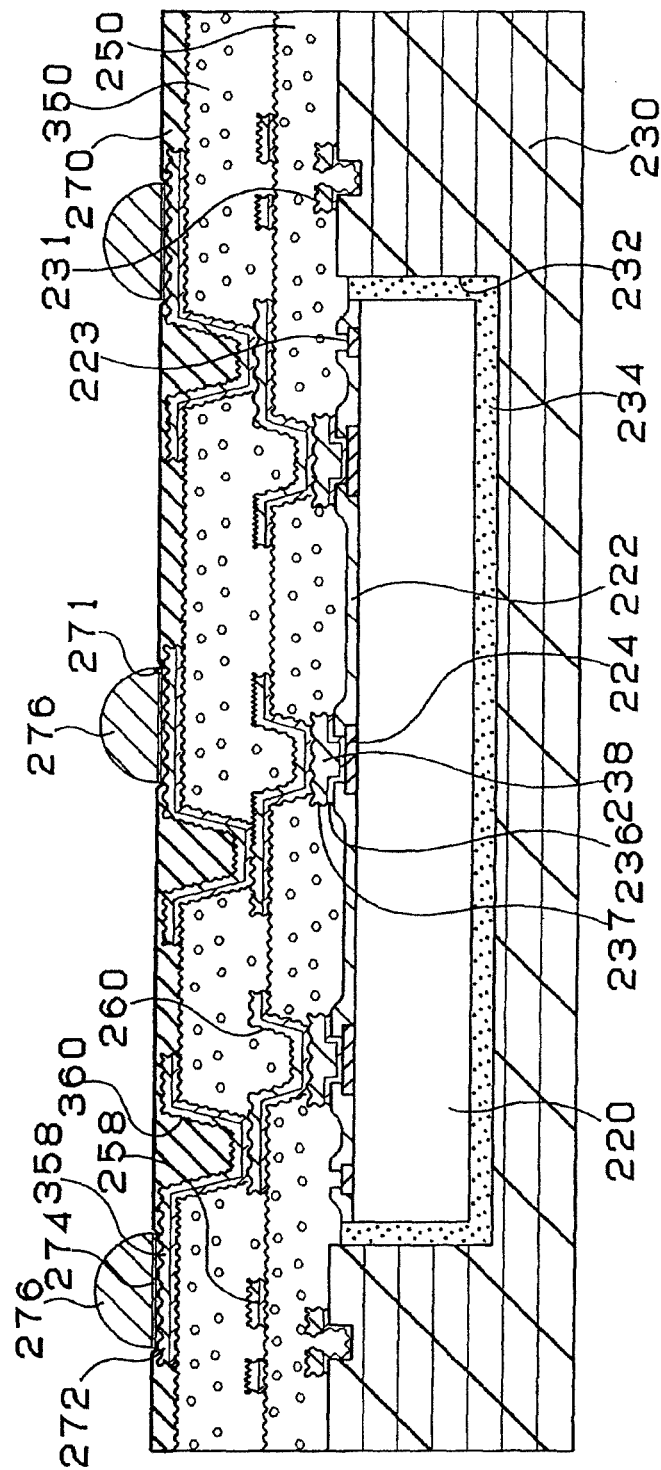
FIG. 18 is a cross-sectional view of the multilayer printed circuit board in the second embodiment.

Next, the constitution of a multilayer printed circuit boar according to the second embodiment of the present invention will be described with reference to FIG. 18 showing the cross-section of a multilayer printed circuit board 210.

As shown in FIG. 18, the multilayer printed circuit board 210 consists of a core substrate 230 containing therein an IC chip 220, an interlayer resin insulating layer 250 and an interlayer resin insulating layer 350. Via holes 260 and conductor circuits 258 are formed on the interlayer resin insulating layer 250. Via holes 360 and conductor circuits 358 are formed on the interlayer resin insulating layer 350.

The IC chip 220 is covered with a passivation film 222, and die pads 224 each constituting an input/output terminal and positioning marks 223 are provided in the respective openings of the passivation film 222. A transition layer 238 mainly consisting of copper is formed on each die pad 224.

A solder resist layer 270 is provided on the interlayer resin insulating layer 350. BGA's 276 for connecting to an external substrate, such as a daughter board or a mother board which is not shown, are provided on the conductor circuits 358 under the openings 271 of the solder resist layer 270, respectively.

In the multilayer printed circuit board 210 in the second embodiment, the IC chip 220 is included in the core substrate 230 in advance and the transition layer 238 is provided on each die pad 224 of the IC chip 220. Due to this, it is possible to electrically connect the IC chip to the multilayer printed circuit board (or package substrate) without using lead members and a sealing resin.

Furthermore, by providing the transition layers 238 made of copper on the respective die pads 224, it is possible to prevent resin residues on the die pads 224 and to prevent the die pads 224 from being discolored or dissolved even after impregnating the multilayer printed circuit board in an acid, an oxidizer or an etching solution in a later step or conducting various annealing steps.

Moreover, in manufacturing steps to be described later, positioning marks 231 are formed on the core substrate 230 with reference to the positioning marks 223 of the IC chip 220 and the via holes 260 are formed to conform to the positioning marks 231, respectively. Due to this, it is possible to accurately position the via holes 260 on the pads 224 of the IC chip 220 and to ensure connecting the pads 224 to the via holes 260, respectively.

Next, a method of manufacturing the multilayer printed circuit board described above with reference to FIG. 18 will be described with reference to FIGS. 13 to 17.

(1) First, an insulating resin substrate (or core substrate) 230, in which prepregs each having a core material made of glass cloths or the like and impregnated with a resin such as epoxy are built up, is used as a starting material (see FIG. 13(A)). Next, a recess 232 for containing an IC chip is formed on one side of the core substrate 230 by counter boring (see FIG. 13(B).

(2) Then, an adhesive material 234 is applied to the recess 232 using a printing machine. At this time, potting instead of application may be conducted. Next, an IC chip 220 is mounted on the adhesive material 234 (see FIG. 13(C)).

(3) The upper surface of the IC chip 220 is depressed or struck to thereby completely contain the IC chip 220 in the recess 232 (see FIG. 13(D)). The plan view of the IC chip 220 and the core substrate 230 shown in FIG. 13(D) are shown in FIG. 19(A). The IC chip 220 contained in the recess 232 of the core substrate 230 is not accurately positioned relative to the core substrate because of the working accuracy of the recess and the interposition of the adhesive material 234.

(4) The positioning marks 223 provided in the four corners of the IC chip 220 are photographed by a camera 280, and recesses 231a are provided in the four corners of the core substrate 230 with reference to the positioning marks 223, respectively, by laser (FIG. 13(E)). The plan view of the IC chip 220 and the core substrate 230 shown in FIG. 13(E) is shown in FIG. 19(B).

(5) Thereafter, the entire surface of the core substrate 230 which contains the IC chip 220 therein is subjected to deposition or sputtering, to form a conductive metallic film 233 on the entire surface (FIG. 14(A)). The metal used is formed out of one or more of tin, chromium, titanium, nickel, zinc, cobalt, gold, copper and the like. In some cases, two or more layers may be formed out of different metals. The thickness of the metallic layer is preferably in the range of 0.001 to 2.0 μm. More preferably, the thickness is 0.01 to 1.0 μm.

A plated film 236 may be formed on the metallic film 233 by electroless plating, electroplating or a combination thereof (FIG. 14(B)). The type of the metal used for plating is exemplified by copper, nickel, gold, silver, zinc or iron. Copper is preferably used because it has appropriate electrical characteristic and is economical and buildup conductor layers formed in a later step mainly consist of copper. The thickness of the plated film is preferably in the range of 0.01 to 5.0 μm. If the thickness is smaller than 0.01 μm, the plated film cannot be formed on the entire surface. If the thickness exceeds 5.0 μm, it becomes difficult to etch away the film. Besides, the positioning marks are embedded and cannot be recognized. The preferable range is 0.1 to 3.0 μm. The plated film can be also formed by sputtering or deposition.

(6) Thereafter, a resist 235α is provided, a mask 239 on which patterns 239a and positioning marks 239b corresponding to the pads 224 are drawn is mounted (FIG. 14(C)). This mask 235 is positioned while applying light from above and the image of reflection light from the positioning marks 231 is picked up by a camera 289 so that the positioning mark through holes 231a on the core substrate 230 side can fall in the positioning marks 239b which are drawn to be ring-shaped. In the second embodiment, since the copper plated film 236 is formed even on the positioning marks 231, the reflection light easily transmits the resist 235α and the substrate and the mask can be easily positioned relative to each other.

(7) Plating resists 235 are formed so as to provide opening portions above the respective pads 224 of the IC chip by exposure and development and electroplated films 237 are provided by electroplating (FIG. 14(D)). After removing the plating resists 235, the electroless plated film 236 and the metallic film 233 under the plating resists 235 are removed, thereby forming transition layers 238 on the pads 224 of the IC chip and forming positioning marks 231 on the recesses 231a, respectively (FIG. 14(E)).

(8) Next, an etching solution is sprayed on the substrate and the surfaces of the transition layers 238 are etched, thereby forming rough surfaces 238α, respectively (see FIG. 15(A)). The rough surfaces can be formed by electroless plating or an oxidization-reduction process.

(9) The same thermosetting resin sheet as that in the first embodiment is vacuum-compression laminated onto the substrate which has gone through the above-stated steps and an interlayer resin insulating layer 250 is provided (see FIG. 15(B)).

(10) Next, the images of the positioning marks 231 are picked up by the camera 280 while transmitting the interlayer resin insulating layer 250, thereby conducting positioning. Via hole openings 248 each having a diameter of 80 μm are provided in the interlayer resin insulating layer 250 using $CO_2$ gas laser having a wavelength of 10.4 μm under the conditions of a beam diameter of 5 mm, a pulse width of 5.0 μseconds, a mask hole diameter of 0.5 mm and one shot (see FIG. 15(C)).

(11) Next, the surface of the interlayer resin insulating layer 250 is roughened to thereby form a rough surface 250α (see FIG. 15(E)).

(12) Then, a metallic layer 252 is formed on the surface of the interlayer resin insulating layer 250 (see FIG. 16(A)).

(13) A commercially available photosensitive dry film 254α is bonded to the substrate 230 which has been completed with the above-stated steps, and a photomask film 253, on which patterns 253a and positioning marks 253b corresponding to the pads are drawn, is mounted. The plan view of the core substrate 230 before the photomask film 253 is mounted is shown in FIG. 20(A) and a state in which the photomask film 253 is mounted is shown in FIG. 20(B). This mask 253 is positioned while light is applied from above and the image of reflection light from the positioning marks 231 is picked up by the camera 289 so that the positioning marks 231 at the core substrate 230 side may fall in the positioning marks 253b which are drawn to be ring-shaped. In the second embodiment, since the plated film 237 is formed on the positioning marks 231, the reflection light is easily transmitted by the interlayer resin insulating layer 250 and the film 254α and accurate positioning can be conducted. As stated above, the roughening process is conducted to the copper plated films 237 constituting the positioning marks 231. It is also possible not to conduct the roughening process so as to increase surface reflectance or to conduct the roughening process and then conducting a surface smoothening process using chemicals or laser.

(14) Thereafter, exposure is performed with 100 $J/cm^2$ and a development process is conducted with 0.8% of sodium carbonate, thereby forming plating resists 254 each having a thickness of 15 μm (FIG. 16(C)).

(15) Next, electroplating is conducted under the same conditions as those in the first embodiment to thereby form an electroplated film 256 having a thickness of 15 μm (see FIG. 16(D)).

(16) After separating and removing the plating resists 254 with 5% NaOH, the metallic layer 252 under the plating resists 254 are dissolved and removed by etching and conductor circuits 258 each consisting of the metallic layer 252, the electroplated film 256 and via holes 260 are formed and rough surfaces 258α and 260α are formed with an etching solution (see FIG. 17(A)).

(17) Next, the steps of (6) to (12) stated above are repeated, thereby forming an interlayer resin insulating layer 350 and conductor circuits 358 (include via holes 360) further above (see FIG. 17(B)).

(18) Next, the same solder resist composition as that in the first embodiment is applied to the substrate 230 to have a thickness of 20 μm, and a drying process is conducted. After that, exposure is conducted with a photomask hermetically contacted with the solder resist layer 270, a development process is conducted with a DMTG solution, and opening portions 270 each having a diameter of 200 μm are formed (see FIG. 17(C)).

(19) Then, the substrate on which the solder resist layer (or organic resin insulating layer) 270 is formed is immersed in an electroless nickel plating solution, thereby forming nickel plated layers 272 on opening portions 271, respectively. Further, the substrate is immersed in the electroless plating solution and a gold plated layer 274 having a thickness of 0.03 μm is formed on each of the nickel plated layers 272, thereby forming solder pads 275 on the conductor circuits 358, respectively (see FIG. 17(D)).

(20) Thereafter, a solder paste is printed on the opening portions 271 of the solder resist layer 270 and reflowed at 200° C., thereby forming BGA's 276. Thus, it is possible to obtain a multilayer printed circuit board 210 including the IC chip 220 and having the BGA's 276 (see FIG. 18). PGA's (conductive connection pins) instead of the BGA's may be arranged.

First Modification of Second Embodiment

Figure 21:
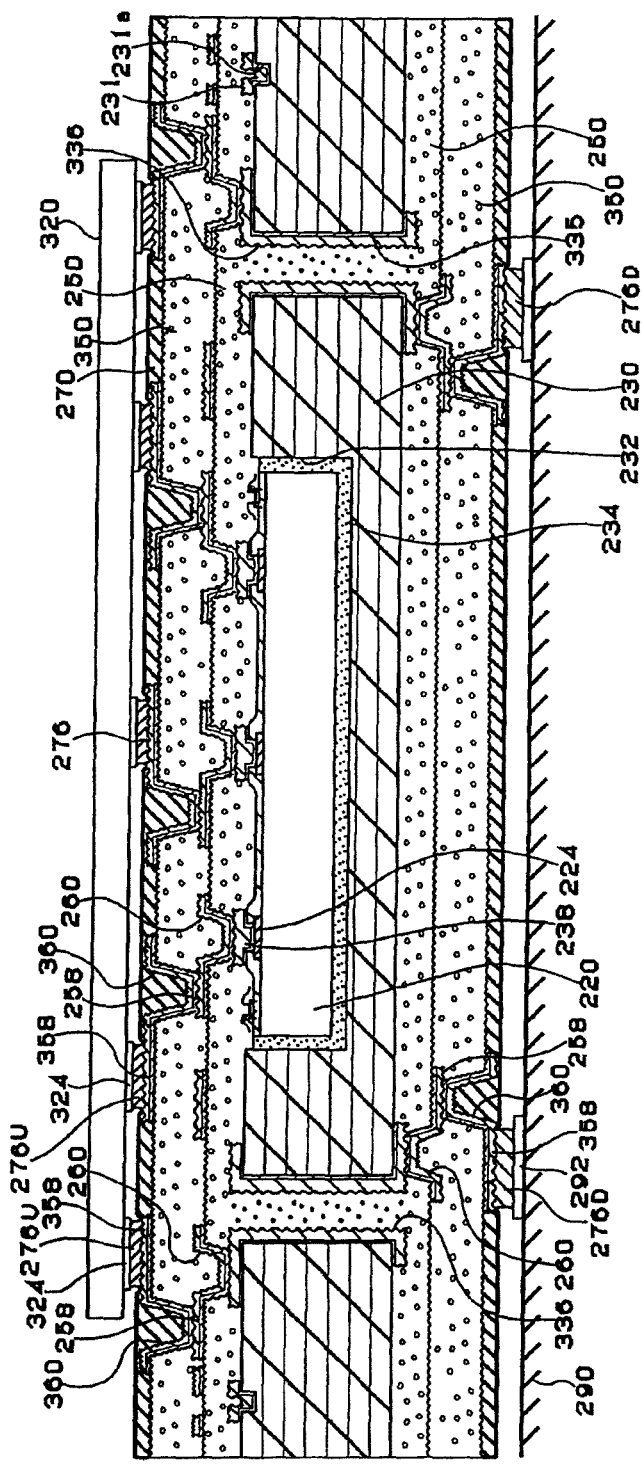
FIG. 21 is a cross-sectional view of a multilayer printed circuit board in the first modification of the second embodiment.

Next, description will be given to a multilayer printed circuit board according to the first modification of the second embodiment of the present invention with reference to FIG. 21.

In the second embodiment stated above, the IC chip is contained in the multilayer printed circuit board. In the first modification of the second embodiment, by contrast, an IC chip 220 is contained in the multilayer printed circuit board and, at the same time, an IC chip 320 is mounted on the surface thereof. As for the IC chip 220 included in the circuit board, a cache memory having a relatively low calorific value is employed. As for the IC chip 320 on the surface, a CPU for arithmetic operation is mounted.

In this first modification of the second embodiment, penetrating holes 335 constituting the through holes 336 of a core substrate 230 are formed with reference to the positioning marks 231 of the core substrate.

Third Embodiment

Figure 26:
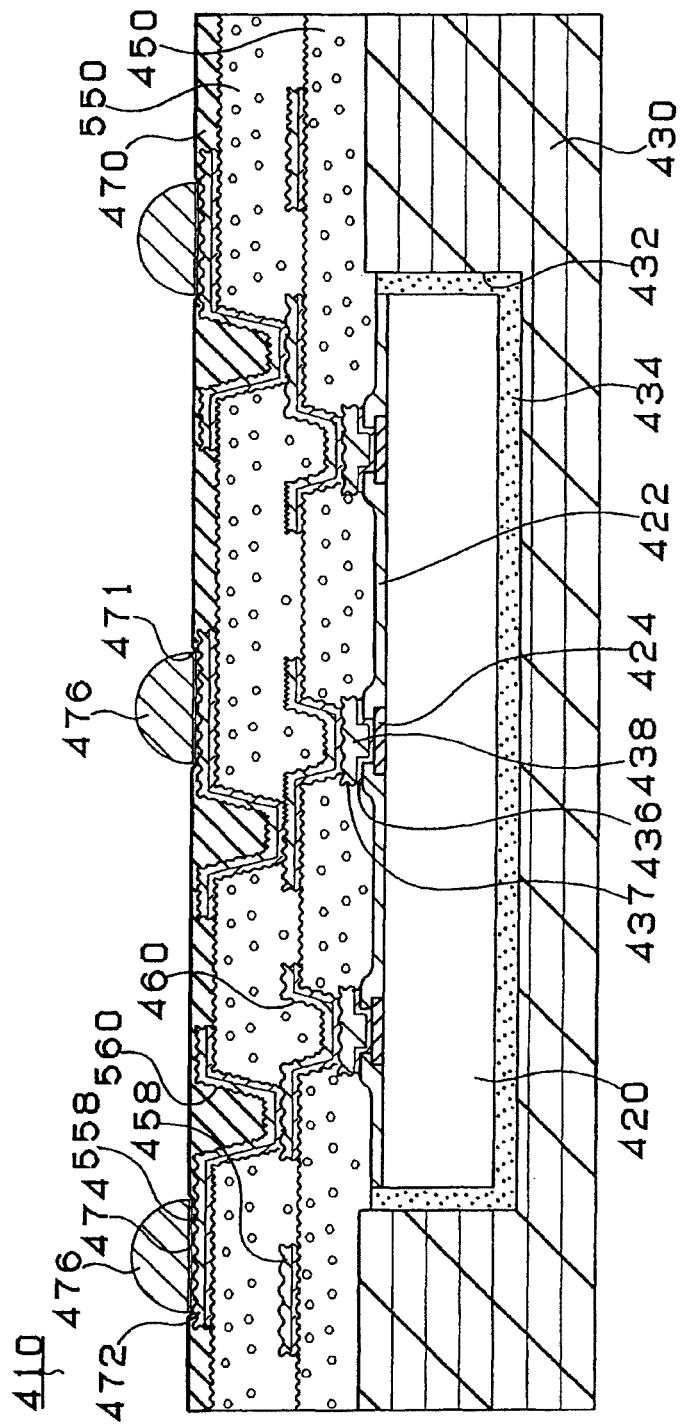
FIG. 26 is a cross-sectional view of the multilayer printed circuit board in the third embodiment.

Next, the constitution of a multilayer printed circuit board according to the third embodiment of the present invention will be described hereinafter with reference to FIG. 26 showing the cross section of a multilayer printed circuit board 410.

As shown in FIG. 26, the multilayer printed circuit board 410 consists of a core substrate 430 containing therein an IC chip 420, an interlayer resin insulating layer 450 and an interlayer resin insulating layer 550. Via holes 460 and conductor circuits 458 are formed on the interlayer resin insulating layer 450. Via holes 560 and conductor circuits 558 are formed on the interlayer resin insulating layer 550.

The IC chip 420 is covered with an IC protective film (made of passivation+polyimide) 422 and aluminum die pads 424 each constituting an input/output terminal are provided in the respective openings of the IC protective film 422. An oxide film 426 is formed on each die pad 424. A transition layer 438 is formed on each die pad 424 and the oxide film 426 on the surface, on which the die pad 424 and the transition layer 438 contact with each other, is removed.

A solder resist layer 470 is formed on the interlayer resin insulating layer 550. A solder bump 476 or a conductive connection pin, which is not shown, for connecting to an external substrate such as a daughter board or a mother board, which is not shown, is provided on the conductor circuit 558 under each opening portion 471 of the solder resist layer 470.

In the multilayer printed circuit board 410 in this embodiment, the IC chip 420 is included in the core substrate 430 in advance and the transition layers 420 are provided on the die pads 424 of the IC chip 420, respectively. Due to this, alignment can be easily made when forming via holes and buildup layers can be stably formed even with a die pad pitch of 150 μm or less and a pad size of 20 μm or less. If the via holes of the interlayer resin insulating layers are formed by photoetching with the die pads on which the transition layers are not formed and via hole diameter is larger than a die pad diameter, then the polyimide layer serving as the protective layer on the surface of each die pad is dissolved and damaged during a de-smear process conducted as a via hole bottom residue removal process and a interlayer resin insulating layer surface roughening process. On the other hand, in case of using laser, if the via hole diameter is larger than the die pad diameter, the die pads and passivation-polyimide layers (or IC protective films) are damaged by laser. Moreover, if the pads of the IC chip are very small and the via hole diameter is larger than the die pad size, then positioning becomes quite difficult even with a photoetching method or a laser method. As a result, connection errors between the die pads and the via holes frequently occur.

By providing the transition layers 438 on the respective die pads 424, by contrast, it is possible to ensure the connection of the via holes 460 to the die pads 424 even with a die pad pitch of 150 μm or less and a pad size of 20 μm or less, and the connection characteristic between the pads 424 and the via holes 460 and reliability are improved. Further, by interposing the transition layers each having a larger diameter on the respective pads of the IC chip, there is no fear of dissolving and damaging the die pads and the IC protective films (passivation-polyimide layers) even if the substrate is immersed in an acid or an etching solution in later steps such as de-smear and plating steps or the substrate has gone through various annealing steps.

Furthermore, since the oxide film 426 formed on the die pads 424 made of aluminum is removed on the surfaces on which the die pads 424 and the transition layers 438 contact with one another by an oxide film removal process to be described later, it is possible to reduce the electrical resistances of the die pads 424 and to increase the electrical conductivity thereof.

Next, a method of manufacturing the multilayer printed circuit board described above with reference to FIG. 26 will be described with reference to FIGS. 22 to 27.

(1) First, an insulating resin substrate (or core substrate) 430 in which prepregs each having a core material made of glass cloths or the like and impregnated with a resin such as epoxy are built up, is used as a starting material (see FIG. 22(A)). Next, a recess 432 for containing an IC chip is formed on one side of the core substrate 430 by counter boring (see FIG. 22(B)).

(2) Then, an adhesive material 434 is applied to the recess 432 using a printing machine. At this time, potting instead of application may be conducted. Next, an IC chip 420 is mounted on the adhesive material 434. The IC chip 420 is covered with an IC protective film (made of passivation+polyimide) 422, and die pads 424 each constituting an input/output terminal are provided in the respective openings of the IC protective film 422. Also, the surfaces of the die pads 424 are covered with oxide films 426, respectively (see FIG. 22(C)). Here, an explanatory view enlarging the die pad 424 portion of the IC chip 420 is shown in FIG. 27(A).

(3) Then, the upper surface of the IC chip 420 is depressed or struck to thereby completely contain the IC chip 420 in the recess 432 (see FIG. 22(D)). It is thereby possible to flatten the core substrate 430.

(4) Next, the core substrate 430 containing therein the IC chip 420 is put in a sputtering device in a vacuum state. While argon gas which is inactive gas is used as sputtering gas, inverse sputtering is performed with the exposed oxide films 426 on the surfaces of the die pads 424 as targets, thereby removing the exposed oxide films 426 (see FIG. 23(A)). Here, an explanatory view enlarging the die pad 424 portion of the IC chip 420 is shown in FIG. 27(B). It is thereby possible to reduce the electric resistances of the die pads 424, to improve the electric conductivities thereof and to improve the adhesiveness thereof with corresponding transition layers. In this case, inverse sputtering is employed as an oxide film removal process. A plasma process instead of the inverse sputtering can be employed. In case of the plasma process, the substrate is put in a device in a vacuum state, plasmas are discharged in oxygen or nitrogen, carbon dioxide and carbon tetrafluoride to thereby remove the oxide films on the surfaces of the die pads. It is also possible to process the die pad surfaces with an acid other than the plasma process and to remove the oxide films. It is preferable to use a phosphoric acid in the oxide film removal process. The oxide films are removed herein. Even if films such as anticorrosive nitride films are formed on the die pads, it is preferable to conduct a removal process so as to improve the electric conductivities of the die pads.

(5) Thereafter, using the same device consecutively, the entire surface of the core substrate 430 is sputtered with Cr and Cu as targets without exposing the IC chip to an oxygen atmosphere, thereby forming a conductive metallic film 433 on the entire surface (see FIG. 23(B)). The metallic film 433 is preferably formed out of one or more layers of metals such as tin, chromium, titanium, nickel, zinc, cobalt, gold and silver. The thickness of the metallic film is preferably formed to be in the range of 0.001 to 2.0 μm. The thickness is more preferably 0.01 to 1.0 μm. The thickness of a chromium layer is set so as not to generate cracks on the sputtered layer and to sufficiently hermetically contact with a copper sputtered layer. In the third embodiment, the removal of films and the formation of the lowermost layer (metallic layer) 433 of each transition layer are conducted in the same device under a non-oxygen atmosphere in succession. Due to this, it is possible to improve the electric conductivity between the die pads 424 of the IC chip and the transition layer 438 without forming oxide films on the pad surfaces again.

A plated film 436 may be formed on the metallic film 433 by electroless plating, electroplating or a combination thereof (see FIG. 23(C)). The type of the metal used for plating is exemplified by copper, nickel, gold, silver, zinc or iron. Copper is preferably used because it has appropriate electrical characteristic and is economical and buildup conductor layers formed in a later step mainly consist of copper. The thickness of the plated film is preferably in the range of 0.01 to 5.0 μm. The thickness is more preferably 0.1 to 3 μm. The plated film can be also formed by sputtering or deposition. The desirable combination of the first thin film layer and the second thin film layer is chromium-copper, chromium-nickel, titanium-copper, titanium-nickel or the like. These combinations are superior to the other combinations in junction with metal and electric conductivity.

(6) Thereafter, a resist is applied or a photosensitive film is laminated, and plating resists 435 are provided to provide openings on the upper portions of the pads of the IC chip 420 by exposure and development, thereby forming electroplated films 437 (see FIG. 23(D)). The thickness of the electroplated film 437 is preferably about 1 to 20 μm. After removing the plating resists 435, the electroless plated film 436 and the metallic film 433 under the plating resists 435 are etched away, thereby forming transition layers 438 on the pads 424 of the IC chip, respectively (see FIG. 24(A)). Also, an explanatory view enlarging the die pad 424 portion of the IC chip 420 is shown in FIG. 27(C).

In this case, the transition layers 438 are formed by the plating resists. It is also possible to form the transition layers 438 on the die pads 424 of the IC chip 420 by uniformly forming electroplated films 437 on the respective electroless plated film 436, forming an etching resist, conducting exposure and development to expose the portions of the metal other than those on the transition layers and conducting etching. In this case, the thickness of the electroless plated film 437 is preferably in the range of 1 to 20 μm. If the thickness exceeds that range, undercut occurs during the etching and gaps are generated in the interfaces between the transition layers and via holes to be formed.

(7) Next, an etching solution is sprayed on the substrate, the surfaces of the transition layers 438 are etched to thereby form rough surfaces 438α on the respective surfaces (see FIG. 24(B)). It is also possible to form the rough surfaces by electroless plating or an oxidization-reduction process.

(8) A thermosetting resin sheet is vacuum-compression laminated onto the substrate which has gone through the above-stated steps as in the case of the first embodiment, thereby providing an interlayer resin insulating layer 450 (see FIG. 24(C)).

(9) Next, via hole openings 448 are provided in the interlayer resin insulating layer 450 using $CO_2$ gas laser (see FIG. 24(D)). Thereafter, resin residues on the openings 448 may be removed using an oxidizer such as a chromic acid or a permanganic acid. By providing the transition layers 438 made of copper on the die pads 424, respectively, alignment can be easily made at the time of forming via holes, the connection of the via holes onto the die pads 424 is ensured and the connection characteristics between the pads and the via holes and reliability are improved. Thus, it is possible to stably form buildup layers. By providing the transition layers each having a larger diameter on the respective pads of the IC chip, there is no fear of dissolving and damaging the die pads 424 and the IC protective films (passivation-polyimide layers) 422 even if the substrate is immersed in an acid or an etching solution in later steps such as a via hole bottom residue removal process, a de-smear process conducted as an interlayer resin insulating layer surface roughening process, a plating step and the like or if the substrate has gone through various annealing steps. In this case, the resin residues are removed by using a permanganic acid. It is also possible to conduct a de-smear process using oxygen plasma.

(10) Next, the surface of the interlayer resin insulating layer 450 is roughened to thereby form a rough surface 450α (see FIG. 25(A)). This roughening step can be omitted.

(11) Next, after a palladium catalyst is supplied to the surface of the interlayer resin insulating layer 450, the substrate is immersed in an electroless plating solution and an electroless plated film 452 is formed on the surface of the interlayer resin insulating layer 450 (see FIG. 25(B)).

(12) A commercially available photosensitive dry film is bonded to the substrate 430 which has been subjected to the above processes, a chromium glass mask is mounted, exposure is performed with 40 mj/cm$^2$ and then a development process is conducted with 0.8% sodium carbonate, thereby providing plating resists 454 each having a thickness of 25 μm. Next, electroplating is conducted under the same conditions as those in the first embodiment, thereby forming electroplated films 456 each having a thickness of 18 μm (see FIG. 25(C)).

(13) After separating and removing the plating resists 454 with 5% NaOH, the electroless plated film 452 under the plating resists is dissolved and removed by etching, conductor circuits 458 each consisting of the electroless plated film 452 and the electroplated film 456 and having a thickness of 16 μm and via holes 460 are formed, and rough surfaces 458α and 460α are formed by an etching solution (see FIG. 25(D)). The following steps are the same as the steps (13) to (17) in the first embodiment stated above, which description will not be given herein.

First Modification of Third Embodiment

Figure 28:
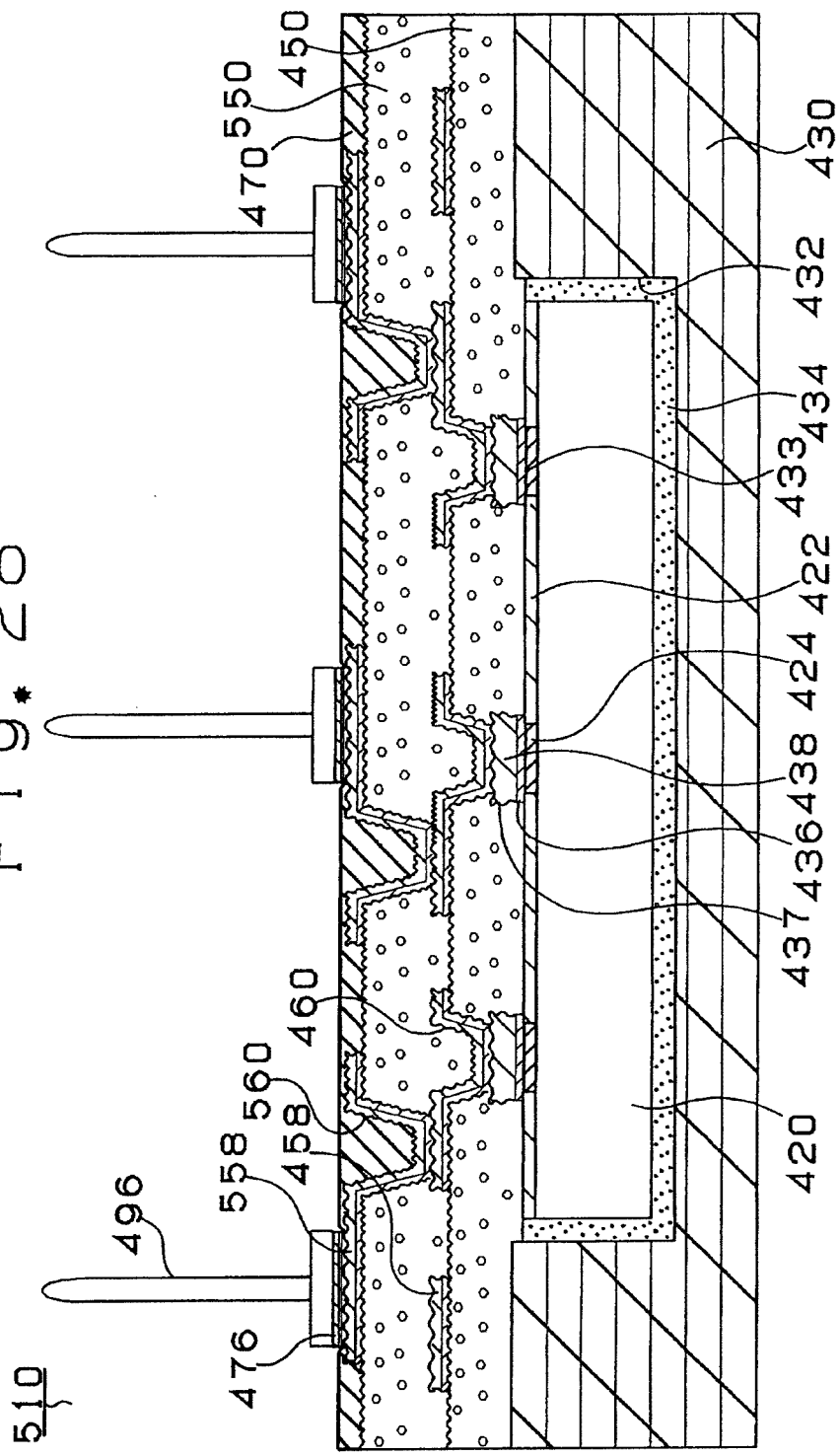
FIG. 28 is a cross-sectional view of a multilayer printed circuit board in the first modification of the third embodiment.

Now, a multilayer printed circuit board according to the first modification of the third embodiment of the present invention will be described with reference to FIGS. 28 and 29. FIG. 28 shows the cross-section of a multilayer printed circuit board 510 and FIG. 29 are views showing an enlarged die pad 424 portion, where FIG. 29(A) is a view showing a state before an oxide film removal process is conducted, FIG. 29(B) is a view showing a state of the oxide film removal process and FIG. 29(C) is a view showing a state after a transition layer 438 is formed on each die pad 424.

In the third embodiment stated above, description has been given to a case where BGA's are provided. In the first modification of the third embodiment, which is almost the same as the third embodiment, the multilayer printed circuit board is constituted in a PGA mode for establishing connection through conductive connection pins 496 as shown in FIG. 28.

In the manufacturing method of the first modification of the third embodiment, a part of the oxide film 426 of the die pad 424 is removed by conducting one of oxide film removal process from among an inverse sputtering process, a plasma process and an acid process as shown in FIG. 29(B). Then, as shown in FIG. 29(C), a transition layer 438 consisting of a metallic film 433, an electroless plated film 436 and an electroplated film 437 are formed on the die pad 424. It is thereby possible to reduce the electric resistance of the die pad 426 and to improve electrical conductivity thereof as in the case of the third embodiment.

Comparison Example

A multilayer printed circuit board was obtained by forming transition layers as in the case of the third embodiment except that film removal was not conducted.

Test Result

The result of evaluating the multilayer printed circuit boards in the third embodiment and in the comparison example with respect to a total of four items of 1) sectional state, 2) resistance measurement value, 3) sectional state after reliability test, and 4) resistance measurement value, is shown in a table of FIG. 30.

1) Sectional State

After forming the transition layer, the layer was cut in cross section and whether or not an oxide film is present on the pad was observed with a microscope (×100).

2) Resistance Measurement Value

After forming the transition layer, connection resistance was measured. A numeric value measured is an average of those measured in 20 places.

3) Sectional State after Reliability Test

After forming the multilayer printed circuit board and then finishing a heat cycle test (1000 cycles with one cycle of (130° C./3 minutes)+(−60° C./3 minutes)), the multilayer printed circuit board was cut in cross section and whether or not an oxide film was present on the pad and whether or not the transition was separated was observed with the microscope (×100).

4) Resistance Measurement Value after Reliability Test

After forming the multilayer printed circuit board and then finishing the heat cycle test (1000 cycles with one cycle of (130° C./3 minutes)+(−60° C./3 minutes)), connection resistance was measured. A numeric value measured is an average of those measured in 20 places.

As shown in the table of FIG. 30, the multilayer printed circuit board in the third embodiment had no oxide film and had a low connection resistance value, so that no problem occurred to electrical connection. Besides, the multilayer printed circuit board in the third embodiment was less deteriorated after the reliability test. It is noted that even after repeating 2000 cycles of the heat cycle test, not so a great increase in resistance value was observed.

In the comparison example, the oxide film remained and the connection resistance value was high. In some cases, portions on which no electrical connection could be established were observed. This trend was more conspicuous after the reliability test.

What is claimed is:

1. A method for manufacturing a printed circuit board, comprising:
   providing a core substrate having an electronic component accommodated in the core substrate;
   forming a positioning mark on the core substrate;
   forming an interlayer insulating layer over the core substrate, the positioning mark and the electronic component;
   forming a via hole opening connecting to the electronic component through the interlayer insulating layer in accordance with the positioning mark on the core substrate; and
   forming a via hole structure in the via hole opening in the interlayer insulating layer such that the via hole structure is electrically connected to the electronic component.

2. The method according to claim 1, wherein the providing of the core substrate comprises forming in the core substrate a recess for accommodating the electronic component and placing the electronic component in the recess.

3. The method according to claim 2, wherein the recess of the core substrate is a through hole portion formed through the core substrate.

4. The method according to claim 2, wherein the recess of the core substrate is a counterbore portion formed in the core substrate.

5. The method according to claim 1, further comprising forming a penetrating hole for a through hole structure through the core substrate in accordance with the positioning mark.

6. The method according to claim 1, wherein the providing of the core substrate comprises forming in the core substrate a recess for completely containing the electronic component and placing the electronic component in the recess.

7. The method according to claim 1, wherein the forming of the via hole opening comprises forming the via hole opening connecting to a connection surface of a terminal of the electronic component through the interlayer insulating layer in accordance with the positioning mark on the core substrate.

8. The method according to claim 1, wherein the forming of the via hole opening comprises forming the via hole opening connecting to a connection portion of the electronic component through the interlayer insulating layer in accordance with the positioning mark on the core substrate.

9. The method according to claim 1, wherein the forming of the via hole opening comprises forming the via hole opening connecting to a terminal of the electronic component through the interlayer insulating layer in accordance with the positioning mark on the core substrate.

10. A method for manufacturing a printed circuit board, comprising:
   providing a core substrate having an electronic component accommodated in the core substrate;
   forming a positioning mark on the core substrate;
   forming an interlayer insulating layer over the core substrate and the electronic component;
   forming a via hole opening connecting to the electronic component through the interlayer insulating layer in accordance with the positioning mark on the core substrate;

forming a via hole structure in the via hole opening in the interlayer insulating layer such that the via hole structure is electrically connected to the electronic component; and forming a penetrating hole for a through hole structure through the core substrate in accordance with the positioning mark.

11. The method according to claim 10, wherein the providing of the core substrate comprises forming in the core substrate a recess for accommodating the electronic component and placing the electronic component in the recess.

12. The method according to claim 11, wherein the recess of the core substrate is a through hole portion formed through the core substrate.

13. The method according to claim 11, wherein the recess of the core substrate is a counterbore portion formed in the core substrate.

14. The method according to claim 10, wherein the providing of the core substrate comprises forming in the core substrate a recess for completely containing the electronic component and placing the electronic component in the recess.

15. The method according to claim 10, wherein the forming of the via hole opening comprises forming the via hole opening connecting to a connection surface of a terminal of the electronic component through the interlayer insulating layer in accordance with the positioning mark on the core substrate.

16. The method according to claim 10, wherein the forming of the via hole opening comprises forming the via hole opening connecting to a connection portion of the electronic component through the interlayer insulating layer in accordance with the positioning mark on the core substrate.

17. The method according to claim 10, wherein the forming of the via hole opening comprises forming the via hole opening connecting to a terminal of the electronic component through the interlayer insulating layer in accordance with the positioning mark on the core substrate.

* * * * *